United States Patent
Shim

(10) Patent No.: US 9,514,828 B2
(45) Date of Patent: Dec. 6, 2016

(54) NONVOLATILE MEMORY DEVICE, ERASE METHOD THEREOF AND MEMORY SYSTEM INCLUDING THE SAME

(71) Applicant: Wonbo Shim, Hwasung (KR)

(72) Inventor: Wonbo Shim, Hwasung (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/814,846

(22) Filed: Jul. 31, 2015

(65) Prior Publication Data
US 2016/0141045 A1    May 19, 2016

(30) Foreign Application Priority Data
Nov. 13, 2014  (KR) .................. 10-2014-0158032

(51) Int. Cl.
| | | |
|---|---|---|
| G11C 11/34 | (2006.01) | |
| G11C 16/24 | (2006.01) | |
| G11C 16/14 | (2006.01) | |
| G11C 16/04 | (2006.01) | |
| G11C 16/26 | (2006.01) | |
| G11C 16/08 | (2006.01) | |
| G11C 16/30 | (2006.01) | |

(52) U.S. Cl.
CPC .......... *G11C 16/24* (2013.01); *G11C 16/0483* (2013.01); *G11C 16/08* (2013.01); *G11C 16/14* (2013.01); *G11C 16/26* (2013.01); *G11C 16/30* (2013.01)

(58) Field of Classification Search
CPC ... G11C 16/24; G11C 16/14; G11C 16/0483; G11C 16/26; G11C 16/08; G11C 16/30
USPC ............. 365/185.11, 185.25, 185.29, 185.33
See application file for complete search history.

(56) References Cited

U.S. PATENT DOCUMENTS

| | | | |
|---|---|---|---|
| 6,295,227 B1* | 9/2001 | Sakui | G11C 8/14 257/E27.103 |
| 6,967,874 B2 | 11/2005 | Hosono | |
| 7,333,371 B2 | 2/2008 | Hosono | |
| 7,679,133 B2 | 3/2010 | Son et al. | |
| 7,843,733 B2* | 11/2010 | Kim | G11C 16/3418 365/185.11 |
| 8,077,525 B2 | 12/2011 | Nakamura | |
| 8,174,903 B2 | 5/2012 | Han et al. | |
| 8,243,528 B2 | 8/2012 | Kwon | |
| 8,300,468 B2 | 10/2012 | Kim | |
| 8,437,199 B2 | 5/2013 | Park | |
| 8,537,617 B2 | 9/2013 | Kim et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,760,928 B2 | 6/2014 | Chen et al. | |
| 2005/0018489 A1 | 1/2005 | Hosono | |

(Continued)

*Primary Examiner* — Viet Q Nguyen
(74) *Attorney, Agent, or Firm* — Harness, Dickey & Pierce, P.L.C.

(57) ABSTRACT

An erase method of a nonvolatile memory device including a plurality of cell strings on a substrate is provided. Each string includes a plurality of memory cells stacked in a direction perpendicular to the substrate, a ground select transistor between the memory cells and the substrate, and string select transistors between the memory cells and a bit line. The erase method includes applying a precharge voltage during a first time to a first string select line, floating the first string select line during a second time after the first time, and applying an erase voltage to the substrate after the first time. The first string select line is connected to the string select transistors at a first height in the cell strings of a same row.

17 Claims, 17 Drawing Sheets

(56) References Cited

U.S. PATENT DOCUMENTS

| | | |
|---|---|---|
| 2006/0114733 A1 | 6/2006 | Hosono |
| 2006/0239077 A1* | 10/2006 | Park .................... G11C 16/0483 365/185.17 |
| 2007/0230253 A1* | 10/2007 | Kim .......................... G11C 8/08 365/185.29 |
| 2008/0019164 A1* | 1/2008 | Hemink ............... G11C 16/344 365/100 |
| 2008/0089132 A1* | 4/2008 | Ito ...................... G11C 16/3477 365/185.22 |
| 2008/0285355 A1* | 11/2008 | Lee ......................... G11C 16/12 365/185.33 |
| 2009/0121271 A1 | 5/2009 | Son et al. |
| 2010/0027353 A1 | 2/2010 | Kwon |
| 2010/0067300 A1 | 3/2010 | Nakamura |
| 2010/0302868 A1 | 12/2010 | Han et al. |
| 2011/0216603 A1 | 9/2011 | Han et al. |
| 2011/0233648 A1 | 9/2011 | Seol et al. |
| 2011/0299331 A1 | 12/2011 | Kim |
| 2011/0299343 A1 | 12/2011 | Lee |
| 2012/0008415 A1 | 1/2012 | Park |
| 2012/0051143 A1 | 3/2012 | Yoon et al. |
| 2012/0257455 A1* | 10/2012 | Oh ......................... G11C 16/10 365/185.22 |
| 2012/0262986 A1 | 10/2012 | Kim et al. |
| 2013/0182502 A1 | 7/2013 | Cheo et al. |
| 2013/0194870 A1* | 8/2013 | Lee ......................... G11C 16/26 365/185.11 |
| 2013/0272067 A1* | 10/2013 | Lee .................... G11C 16/0483 365/185.11 |
| 2013/0279262 A1 | 10/2013 | Yoon et al. |
| 2013/0294166 A1 | 11/2013 | Ha |
| 2013/0343130 A1 | 12/2013 | Chen et al. |
| 2014/0185382 A1* | 7/2014 | Oowada .............. G11C 11/5635 365/185.17 |
| 2015/0170749 A1* | 6/2015 | Park ........................ G11C 16/14 365/185.05 |
| 2015/0221380 A1* | 8/2015 | Lee ......................... G11C 16/10 365/185.11 |

\* cited by examiner

NONVOLATILE MEMORY DEVICE, ERASE METHOD THEREOF AND MEMORY SYSTEM INCLUDING THE SAME

CROSS-REFERENCE TO RELATED APPLICATIONS

This U.S. non-provisional patent application claims priority under 35 U.S.C. §119 to Korean Patent Application No. 10-2014-0158032, filed on Nov. 13, 2014, the entire contents of which are hereby incorporated by reference.

BACKGROUND

Inventive concepts relate to a semiconductor memory, and more particularly, to a nonvolatile memory device, an erase method thereof and a memory system including the same.

A storage device may store data under the control of a host device such as a computer, a smart phone and a smart pad. A storage device may include a device for storing data (e.g., a magnetic disk like a hard disk drive (HDD)) and/or a device for storing data in a semiconductor memory such as a solid state drive (SSD) and a memory card. The semiconductor memory may be a nonvolatile memory.

Examples of nonvolatile memory include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

As semiconductor manufacturing technology develops, capacities in nonvolatile memory devices may increase. Increasing the capacity of a nonvolatile memory device may be accomplished by increasing the number of memory cells of the nonvolatile memory device and/or by increasing the number of bits being stored in the memory cells. In particular, in the case of increasing the number of bits being stored in the memory cells (e.g., bits per memory cell), a storage capacity of a semiconductor memory may increase without changing the size (or substantially changing the size) of the semiconductor memory. However, if the number of bits stored in the memory cell increases, an additional operation may be needed to program data in a memory cell or read data from a memory cell. As a result, an operation speed of the nonvolatile memory device may be reduced.

SUMMARY

Example embodiments of inventive concepts relate to an erase method of a nonvolatile memory device. The nonvolatile memory device includes a plurality of cell strings on a substrate. Each cell string includes a plurality of memory cells stacked in a direction perpendicular to the substrate, a ground select transistor between the memory cells and the substrate, and string select transistors between the memory cells and a bit line. The erase method may include applying a precharge voltage during a first time to a first string select line, floating the first string select line during a second time after the first time, and applying an erase voltage to the substrate after the first time. The first string select line may be connected to the string select transistors at a first height in the cell strings of a same row.

In example embodiments, the erase method may further include floating a second string select line during the floating the first string select line. The nonvolatile memory device may include the second string select line. The nonvolatile memory device may include word lines connected to the memory cells in the cell strings. The first string line may be precharged during the first time in an erase operation. The string select transistors in each of the cell strings may include a first string select transistor and a second string select transistor that is on the first string select transistor. The second string select line may be located above the first string select line and may be connected to the second string select transistors at a second height in the cell strings of the same row. The first string select line may be adjacent to the word lines and may be connected to the first string select transistors at the first height in the cell strings of the same row. The floating the first and second string select lines may include floating the first and second string select lines according to a voltage change of the substrate.

In example embodiments, the floating the first select line may include floating the first string select line at a first voltage level, the floating the second select line may include floating the second string select line at a second voltage level, and the first voltage level of the first string select line may be greater than the second voltage level of the second string select line.

In example embodiments, the cell strings may each include a first dummy memory cell. The nonvolatile memory device may include first dummy word lines connected to the first dummy memory cells in the cell strings. The nonvolatile memory device may include word lines connected to the memory cells in the cell strings. The first dummy word lines may be between the first string select line and the word lines. The erase method may further include applying a word line erase voltage to the first dummy word lines.

In example embodiments, the cell strings each may include a first dummy memory cell and a second dummy memory cell on the first dummy memory cell. The nonvolatile memory device may include word lines connected to the memory cells of the cell strings, first dummy word lines connected to the first dummy memory cells, second dummy word lines connected to the second dummy memory cells, and at least one ground select line connected to the cell strings and adjacent to the first dummy word lines. The second dummy word lines may be between the word lines and the ground select line. The erase method further include floating the ground select line and the first dummy word lines.

Example embodiments of inventive concepts relate to a nonvolatile memory device. The nonvolatile memory device may include a memory cell array including a plurality of cell strings on a substrate, each of the cell strings including a plurality of cell transistors stacked in a direction perpendicular to the substrate; an address decoder connected to the cell strings through a ground select line, word lines, dummy word lines, and string select lines; a read & write circuit connected to the cell strings through bit lines; and a voltage generator. The voltage generator may be configured to apply a precharge voltage during a first time of an erase operation to a first string select line among the string select lines. The first string select line may be adjacent to the word lines. The voltage generator may be configured to apply an erase voltage to the substrate and to apply voltages to the address decoder so that the first string select line is floated according to the erase voltage after applying the precharge voltage during the first time to the first string select line.

In example embodiments, the address decoder may be configured to float the first string select line when the voltage generator applies the erase voltage to the substrate.

In example embodiments, the string select lines may include a second string select line above the first string select line, and the address decoder may be configured to float the second string select line when the first string select line is floated.

In example embodiments, the address decoder may be configured to float the ground select line after a specific time from when the erase operation begins.

In example embodiments, some of the dummy word lines may be between the first string select line and the word lines, and the address decoder may be configured to drive at least one of the dummy word lines between the first string select line and the word lines by using a word line erase voltage.

In example embodiments, the address decoder may be configured to concurrently float the ground select line and a dummy word line adjacent to the ground select line among the dummy word lines between the ground select line and the word lines.

In example embodiments, the memory cell array may include a plurality of sub blocks.

In example embodiments, the address decoder may be connected to the sub blocks through the word lines. The address decoder may be configured to apply a word line erase voltage to the word lines connected to a selected sub block among the sub blocks. The address decoder may be configured to apply a precharge voltage to a word line adjacent to the selected sub block and may be connected to an unselected sub block during a time interval in the erase operation. The address decoder may be configured to float all the word lines connected to the unselected sub block if the address decoder applies the erase voltage to the substrate.

In example embodiments, the selected sub block may be between the unselected sub block and the first string select line.

In example embodiments, a memory system may include the nonvolatile memory device and a controller configured to control the nonvolatile memory device.

According to example embodiments of inventive concepts, a nonvolatile memory device includes a plurality of cell strings on a substrate, and a control circuit. Each of the cell strings includes a plurality of cell transistors stacked on top of each other between a ground select transistor and a string select transistor. Each of the cell strings includes at least one of (i) a dummy cell transistor between the string select transistor and the cell transistors and (ii) a dummy cell transistor between the ground select transistor and the cell transistors. The control circuit may be connected to the substrate and connected to the plurality of cell strings through a plurality of bit lines, a ground select line, word lines, at least one dummy word line, and a string select line. The control circuit during a first time interval of an erase operation may be configured to apply a precharge voltage to at least one of the string select line and one of the word lines. The control circuit, during the erase operation after the first time interval, may be configured to apply an erase voltage to the substrate and float the string select line according to the erase voltage applied to the substrate.

In example embodiments, the string select transistor in each of the cell strings may be a first string select transistor. The cell strings may each include a second string select transistor on the first string select transistor. The dummy cell transistor between the ground select transistor and the cell transistors may be a first dummy cell transistor. The cell strings may each include a second dummy cell transistor between the cell transistors and the first dummy cell transistor. The dummy cell transistor between the first string select transistor and the cell transistors may be a third dummy cell transistor. The cell strings may each include a fourth dummy cell transistor between the first string select transistor and the third dummy cell transistor.

In example embodiments, the string select line may be a first string select line that connects the control circuit to the first string select transistors of the cell strings in a same row of the cell strings, and the second string select transistors in the same row of cell strings may be connected to the control circuit through a second string select line. The control circuit during the first interval of the erase operation may be configured to apply a ground voltage to the second string select line. The control circuit during the erase operation after the first time interval may be configured to float the first string select line at a first voltage level and to float the second string select line at a second voltage level according to the erase voltage applied to the substrate. The first voltage level may be less than the second voltage level.

In example embodiments, the string select line may be a first string select line that connects the control circuit to the first string select transistors of the cell strings in a same row of the cell strings. The second string select transistors in the same row of cell strings may be connected to the control circuit through a second string select line. The control circuit during the first interval of the erase operation may be configured to apply a ground voltage to the first string select line and the second string select line and to apply the precharge voltage to the one of the word lines. The control circuit during the erase operation after the first time interval may be configured to float the one of the word lines at a first voltage level and to float the first and second string select lines at a second voltage level according to the erase voltage applied to the substrate. The first voltage level may be less than the second voltage level, and the one of the word lines may be a middle word line among the word lines connecting the control circuit to the cell strings.

In example embodiments, the string select line may be a first string select line that connects the control circuit to the first string select transistors of the cell strings in a same row of the cell strings. The second string select transistors in the same row of cell strings may be connected to the control circuit through a second string select line. The control circuit during the first interval of the erase operation may be configured to apply a ground voltage to the second string select line and to apply the precharge voltage to both the first string select line and the one of the word lines. The control circuit during the erase operation after the first time interval may be configured to float both the one of the word lines and the first string select line at a first voltage level and to float the second string select line at a second voltage level according to the erase voltage applied to the substrate. The first voltage level may be less than the second voltage level, and the one of the word lines may be a middle word line among the word lines connecting the control circuit to the cell strings.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
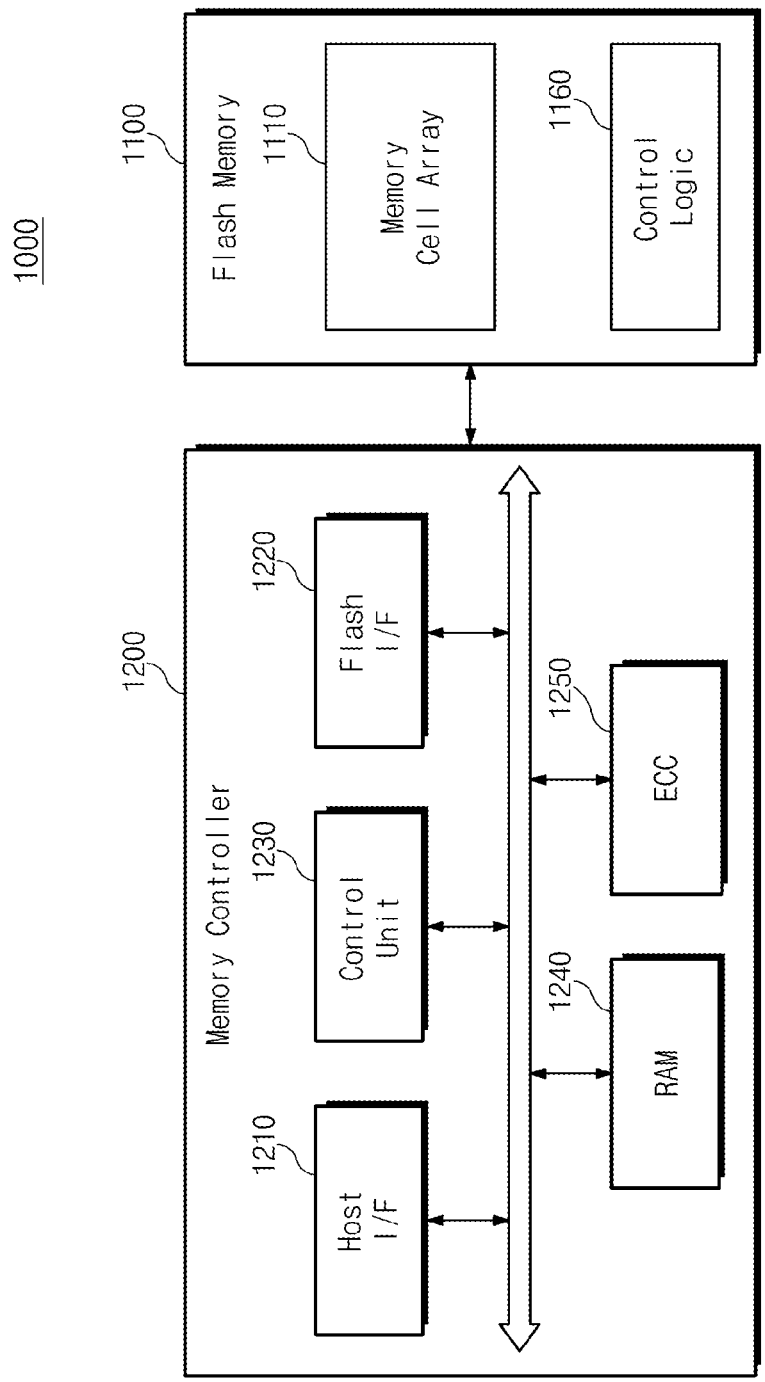
FIG. 1 is a block diagram illustrating a memory system in accordance with example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that when an element such as a layer, region or substrate is referred to as being "on" or "onto" another element, it may lie directly on the other element or intervening elements or layers may also be present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a memory system in accordance with example embodiments of inventive concepts. Referring to FIG. 1, a memory system 1000 includes a flash memory 1100 and a memory controller 1200. The memory system 1000 illustrated in FIG. 1 may include all the data storage mediums based on a flash memory such as a memory card, a USB memory and a SSD.

Referring to FIG. 1, the flash memory 1100 includes a memory cell array 1110 and control logic 1160. The memory cell array 1110 may include a plurality of memory blocks and the memory blocks have a three-dimensional structure (or a vertical structure) formed in a direction perpendicular to a substrate. The control logic 1160 can control program, read and erase operations of the flash memory 1100 using a command CMD, an address ADDR and a control signal CTRL.

The memory controller 1200 can control read, write and erase operations with respect to the flash memory 1100 in response to a request of a host. The memory controller 1200 includes a host interface 1210, a flash interface 1220, a control unit 1230, a RAM 1240 and an ECC circuit 1250.

The memory controller 1200 exchanges data with the host through the host interface 1210 and exchanges data with the flash memory 1100 through the flash interface 1220. The host interface 1210 can be connected to the host through a PATA (parallel AT attachment) bus, a SATA (serial AT attachment) bus, a SCSI, a USB, a PCIe (PCI express), etc.

The control unit 1230 can control an overall operation (for example, a read, a write, a file system management, a bad page management, etc.) of the flash memory 1100. The control unit 1230 may include a central processing unit CPU, a processor, a SRAM, a DMA, a controller, etc.

The RAM 1240 operates under the control of the control unit 1230 and may be used as a work memory, a buffer memory, a cache memory, etc. In the case that the RAM 1240 is used as a work memory, data being processed by the control unit 1230 is temporarily stored in the RAM 1240. In the case that the RAM 1240 is used as a buffer memory, the RAM 1240 is used to buffer data to be transmitted from the host to the flash memory 1100 or from the flash memory 1100 to the host. In the case that the RAM 1240 is used as a cache memory, the RAM 1240 makes the low speed flash memory 1100 operate in high speed.

The ECC circuit 1250 generates an ECC (error correction code) for correcting a fail or error bit of data received from the flash memory 1100. The ECC circuit 1250 performs an error correction encoding of data being provided to the flash memory 1100 to form data to which a parity bit is added. The parity bit may be stored in the flash memory 100.

The ECC circuit 1250 can perform an error correction decoding with respect to data output from the flash memory 1100. The ECC circuit 1250 can correct an error using a parity bit. The ECC circuit 1250 can correct an error using a coded modulation such as a LDPC (low density parity check), a BCH code, a turbo code, a Reed-Solomon code, a convolution code, a RSC (recursive systematic code), a TCM (trellis-coded modulation), a BCM (block coded modulation), etc.

The ECC circuit 1250 has an error correction allowable range. For example, the ECC circuit 1250 can correct an error of the maximum 40 bits with respect to page data of 2 Kbyte. In this case, the maximum allowable range that the ECC circuit 1250 can correct an error is 40 bits. That is, in the case that errors more than 40 bits occur, the ECC circuit 1250 cannot correct errors of the page. The page that cannot correct an error is called a defected page. A memory cell that an error occurs in a defected page is called a defected cell.

In an erase operation, the flash memory 1100 can precharge a string select line (not illustrated) connected to the memory cell array during a desired (and/or alternatively predetermined) time.

Figure 2:
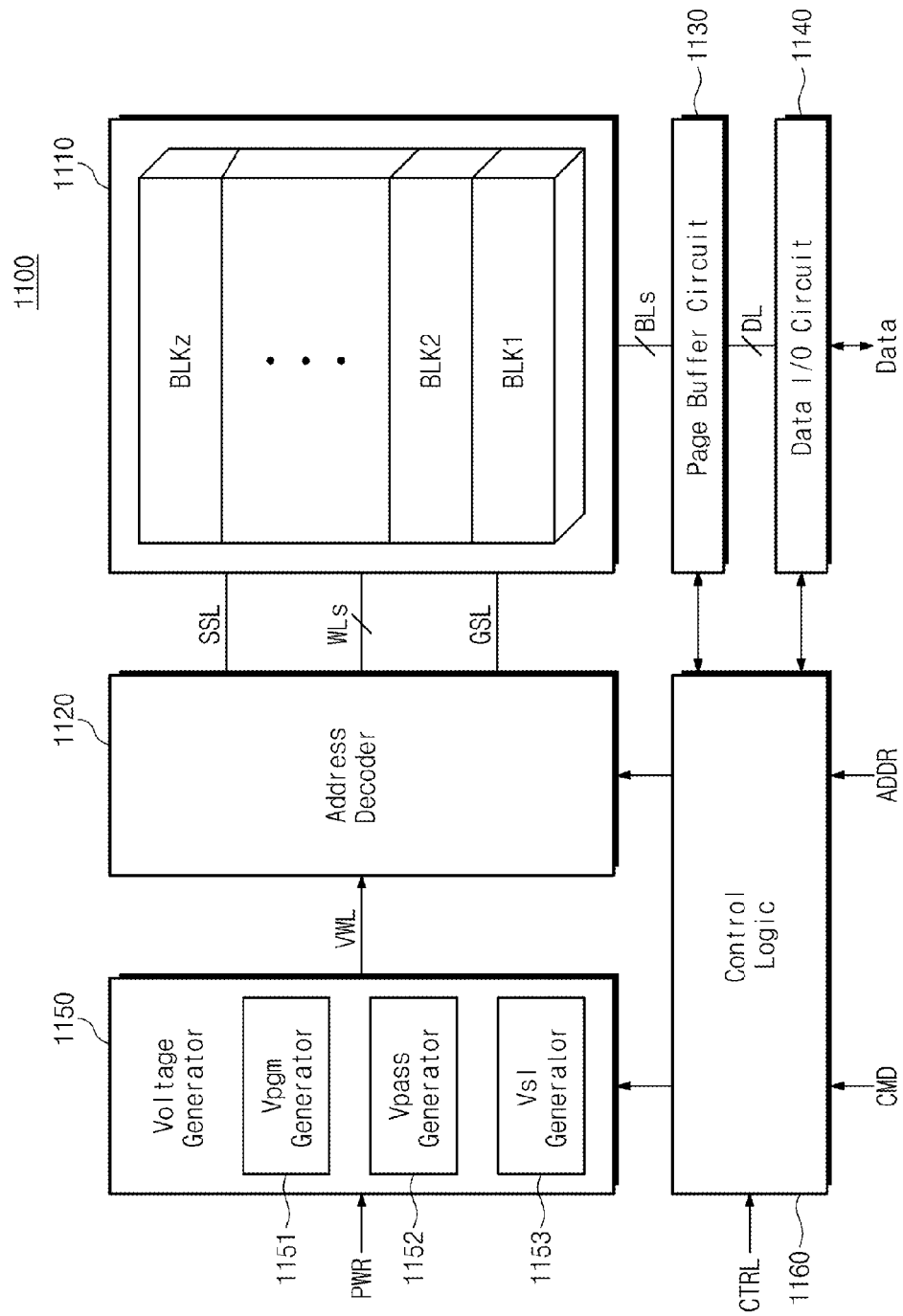
FIG. 2 is a block diagram illustrating a flash memory illustrated in FIG. 1.

FIG. 2 is a block diagram illustrating a flash memory illustrated in FIG. 1. Referring to FIG. 2, the flash memory 1100 includes a memory cell array 1110, an address decoder 1120, a page buffer circuit 1130, a data input/output circuit 1140, a voltage generator 1150 and a control logic 1160. Together, the address decoder 1120, page buffer circuit 1130, data input/output circuit 1140, voltage generator 1150, and control logic 1160 may be a control circuit.

The memory cell array 1110 includes a plurality of memory blocks BLK1~BLKz. Each memory block may have a three-dimensional structure (or a vertical structure). In a memory block having a two-dimensional structure, memory cells are formed in a direction parallel to a substrate. However, in a memory block having a three-dimensional structure, memory cells are formed in a direction perpendicular to the substrate.

The address decoder 1120 may be connected to the memory cell array 1110 through select lines SSL and GSL and/or word lines WLs. The address decoder 1120 may be input with a word line voltage VWL from the voltage generator 1150 and may be controlled by the control logic 1160. The address decoder 1120 may receive a program and/or read voltage.

The page buffer circuit 1130 may be connected to the memory cell array 1110 through bit lines BLs. The page buffer circuit 1130 may include a plurality of page buffers. One or more bit lines may be connected to the page buffer. The page buffer circuit 1130 can temporarily store data to be programmed in a selected page or data read from the selected page.

The data input/output circuit 1140 may be internally connected to the page buffer circuit 1130 through a data line DL and may be externally connected to the memory controller 1200 (refer to FIG. 1) through an input/output line (I/O). In a program operation, the data input/output circuit 1140 may be input with program data from the memory controller 1200 and in a read operation, the data input/output circuit 1140 provides read data to the memory controller 1200.

The voltage generator 1150 may be input with power supply PWR from the memory controller 1200 and generates a word line voltage VWL needed to read or write data. The word line voltage VWL may be provided to the address decoder 1120. The voltage generator 1150 can generate a high voltage HV higher than a power supply voltage Vcc. The high voltage HV may be used as a program voltage Vpgm or a pass voltage Vpass in a program operation, as a read voltage Vread in a read operation and as an erase voltage Verase in an erase operation.

In example embodiments, as illustrated in FIG. 2, the voltage generator 1150 includes a Vpgm generator 1151, a Vpass generator 1152 and a Vsl generator 1153. The Vpgm generator 1151 generates a program voltage Vpgm being provided to a select word line in a program operation. As a program loop proceeds, the program voltage Vpgm may increase. The Vpass generator 1152 generates a pass voltage Vpass being provided to select and unselect word lines in a program operation. Even though a program loop proceeds, the pass voltage Vpass remains constant. The Vsl generator 1153 generates a select line voltage being provided to a string select line SSL or a ground select line GSL.

The control logic 1160 can control program, read and erase operations of the flash memory using a command CMD, an address ADDR and a control signal CTRL being provided from the memory controller 1200. For example, the control logic 1160 makes a program voltage Vpgm provided to a select word line by controlling the address decoder 1120 in a program operation and makes program data provided to a select page by controlling the page buffer circuit 1130 and the data input/output circuit 1140.

Referring to FIGS. 1 and 2, the voltage generator 1150 can precharge a string select line SSL during a desired (and/or alternatively predetermined) time in an erase operation. By precharging the string select line SSL, a lateral spreading phenomenon (in which a lot of holes move to the string select line SSL) can be limited and/or prevented.

Figure 3:
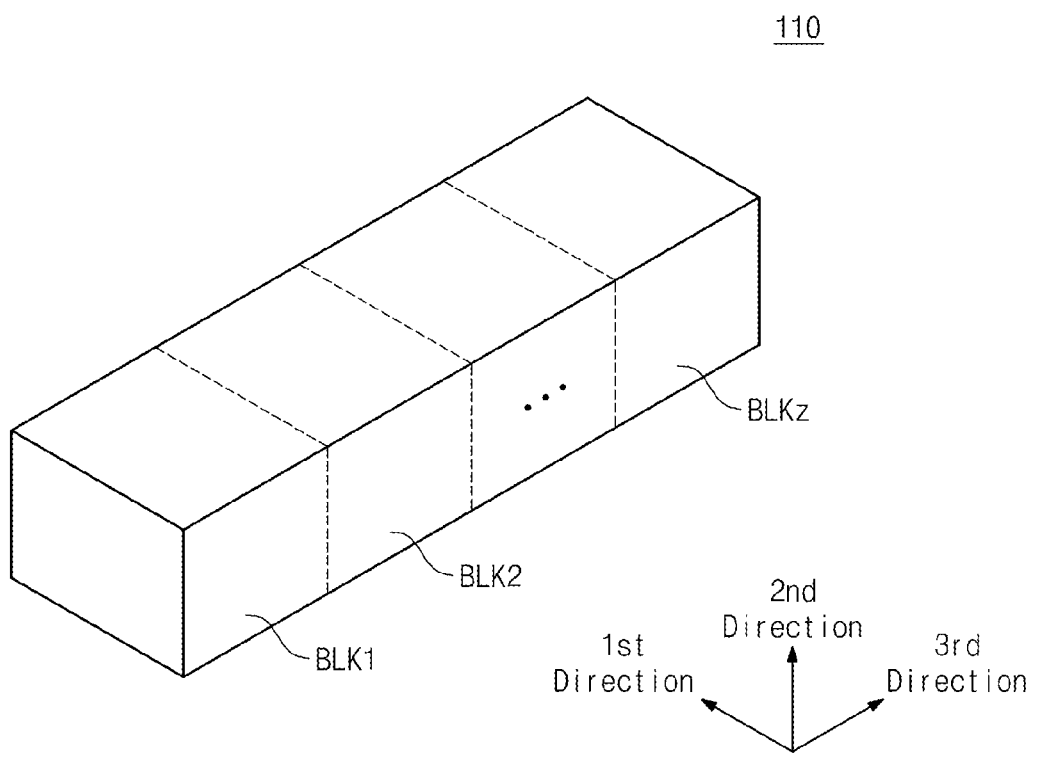
FIG. 3 is a block diagram illustrating a memory cell array illustrated in FIG. 2.

FIG. 3 is a block diagram illustrating a memory cell array illustrated in FIG. 2. Referring to FIG. 2, the memory cell array 110 includes a plurality of memory blocks BLK1~BLKz. Each memory block BLK has a three-dimensional structure (or a vertical structure). For example, each memory block BLK includes structures that extend along first through third directions. Each memory block BLK includes a plurality of NAND strings NS extending along the second direction. A plurality of cell strings CS may be provided along the first and third directions. The cell strings CS may be NAND strings NS.

Each cell string CS may be connected to a bit line BL, a string select line SSL, a ground select line GSL, word lines WL and a common source line CSL. That is, each memory block may be connected to a plurality of bit lines BL, a plurality of string select lines SSL, a plurality of ground select lines GSL, a plurality of word lines WL, and the common source line CSL. The memory blocks BLK1~BLKz may be described in further detail with reference to FIG. 4.

Figure 4:
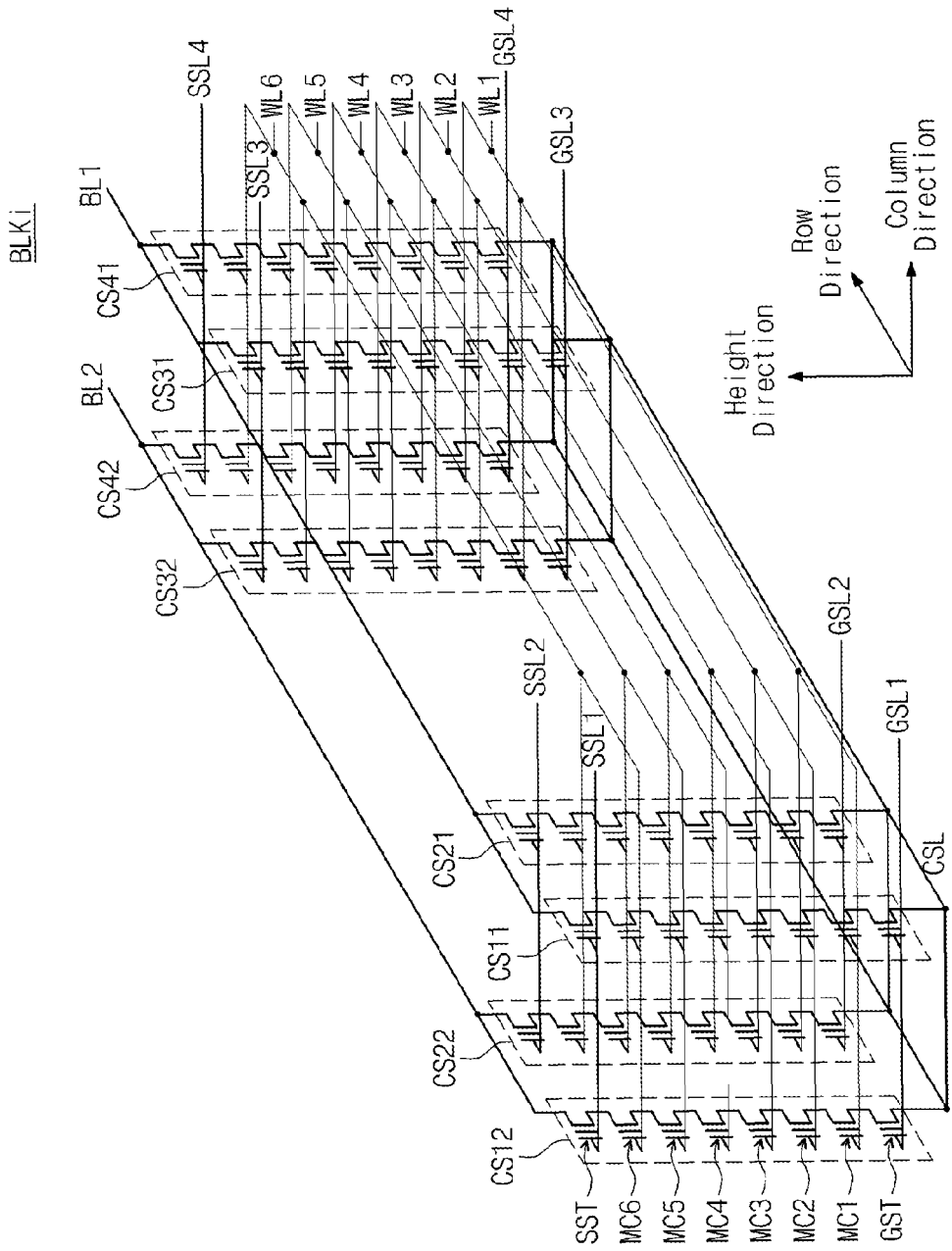
FIG. 4 is a circuit illustrating a memory block BLKi in accordance with example embodiments of inventive concepts.

FIG. 4 is a circuit illustrating a memory block BLKi in accordance with example embodiments of inventive concepts. One of the memory blocks BLK1~BLKz of the memory cell array 110 of FIG. 3 is illustrated in FIG. 4.

Referring to FIGS. 3 and 4, the memory block BLKi includes a plurality of cell strings CS11~CS41 and CS12~CS42. The cell strings CS11~CS41 and CS12~CS42 are arranged along a row direction and a column direction to form rows and columns.

Each cell string includes a ground select transistor GST, memory cells MC1~MC6 and a string select transistor SST. The ground select transistor GST, the memory cells MC1~MC6 and the string select transistor SST of each cell string may be stacked in a height direction perpendicular to a substrate. FIG. 4 illustrates a non-limiting example where each cell string includes six memory cells MC1 to MC6, but example embodiments are not limited thereto and the number of memory cells may be more than 6 and/or less 6 in the cell strings.

Rows of the cell strings CS11~CS41 and CS12~CS42 may be connected to string select lines SSL1~SSL4 different from one another respectively. For example, string select transistors SST of the cell strings CS11 and CS12 may be connected to the string select line SSL1 in common. String select transistors SST of the cell strings CS21 and CS22 may be connected to the string select line SSL2 in common. String select transistors SST of the cell strings CS31 and CS32 may be connected to the string select line SSL3 in common. String select transistors SST of the cell strings CS41 and CS42 may be connected to the string select line SSL4 in common.

Columns of the cell strings CS11~CS41 and CS12~CS42 may be connected to bit lines BL1 and BL2 different from each other respectively. For example, select transistors SST of the cell strings CS11~CS41 may be connected to the bit line BL1 in common. String transistors SST of the cell strings CS12~CS42 may be connected to the bit line BL2 in common.

Rows of the cell strings CS11~CS41 and CS12~CS42 may be connected to ground select lines GSL1~GSL4 different from one another respectively. For example, ground select transistors GST of the cell strings CS11 and CS12 may be connected to the ground select line GSL1 in common. Ground select transistors GST of the cell strings CS21 and CS22 may be connected to the ground select line GSL2 in common. Ground select transistors GST of the cell strings CS31 and CS32 may be connected to the ground select line GSL3 in common. Ground select transistors GST of the cell strings CS41 and CS42 may be connected to the ground select line GSL4 in common.

Memory cells located at the same height from a substrate (or ground select transistors GST) may be connected to one word line in common and memory cells located at different heights from the substrate may be connected to word lines WL1~WL6 different from one another respectively. For example, memory cells MC1 may be connected to the word line WL1 in common. Memory cells MC2 may be connected to the word line WL2 in common. Memory cells MC3 may be connected to the word line WL3 in common. Memory cells MC4 may be connected to the word line WL4 in common. Memory cells MC5 may be connected to the word line WL5 in common. Memory cells MC6 may be connected to the word line WL6 in common.

Ground select transistors GST of the cell strings CS11~CS41 and CS12~CS42 may be connected to a common source line CSL in common.

The memory block BLKi illustrated in FIG. 4 is illustrative. The number of rows of the cell strings may increase or decrease. As the number of rows of the cell strings is changed, the number of string select lines connected to rows of the cell strings and the number of cell strings connected to one bit line may be changed. As the number of rows of the cell strings is changed, the number of ground select lines connected to the rows of the cell strings may also be changed.

The number of the cell strings may increase or decrease. As the number of the cell strings is changed, the number of bit lines connected to columns of the cell strings and the number of cell strings connected to one string select line may be changed.

A height of the cell strings may increase or decrease. For example, the number of memory cells being stacked on each cell string may increase or decrease. As the number of memory cells being stacked on each cell string is changed, the number of word lines may be changed. For example, the number of string select transistors or ground select transistors being provided to each cell string may increase. As the number of the string select transistors or the ground select transistors being provided to each cell string is changed, the number of string select lines or ground select lines may also be changed. If the number of the string select lines or the ground select lines increases, the string select transistors or the ground select transistors may be stacked in the same form as the memory cells MC1~MC6.

Write and read operations may be performed by a row unit of the cell strings CS11~CS41 and CS12~CS42. The cell strings CS11~CS41 and CS12~CS42 may be selected by one row unit by the ground select lines GSL1~GSL4 and the cell strings CS11~CS41 and CS12~CS42 may be selected by one row unit by the string select lines CSL1~CSL4. A voltage may be applied to the ground select lines GSL1~GSL4 considering at least two ground select lines GSL1~GSL2 or GSL3~GSL4 as one unit. A voltage may be applied to the ground select lines GSL1~GSL4 considering the whole ground select lines GSL1~GSL4 as one unit.

In a selected row of the cell strings CS11~CS41 and CS12~CS42, write and read operations may be performed by a page unit. The page may be one row of memory cells connected to one word line. In the selected row of the cell strings CS11~CS41 and CS12~CS42, memory cells may be selected by a page unit by the word lines WL1~WL6.

Figure 5:
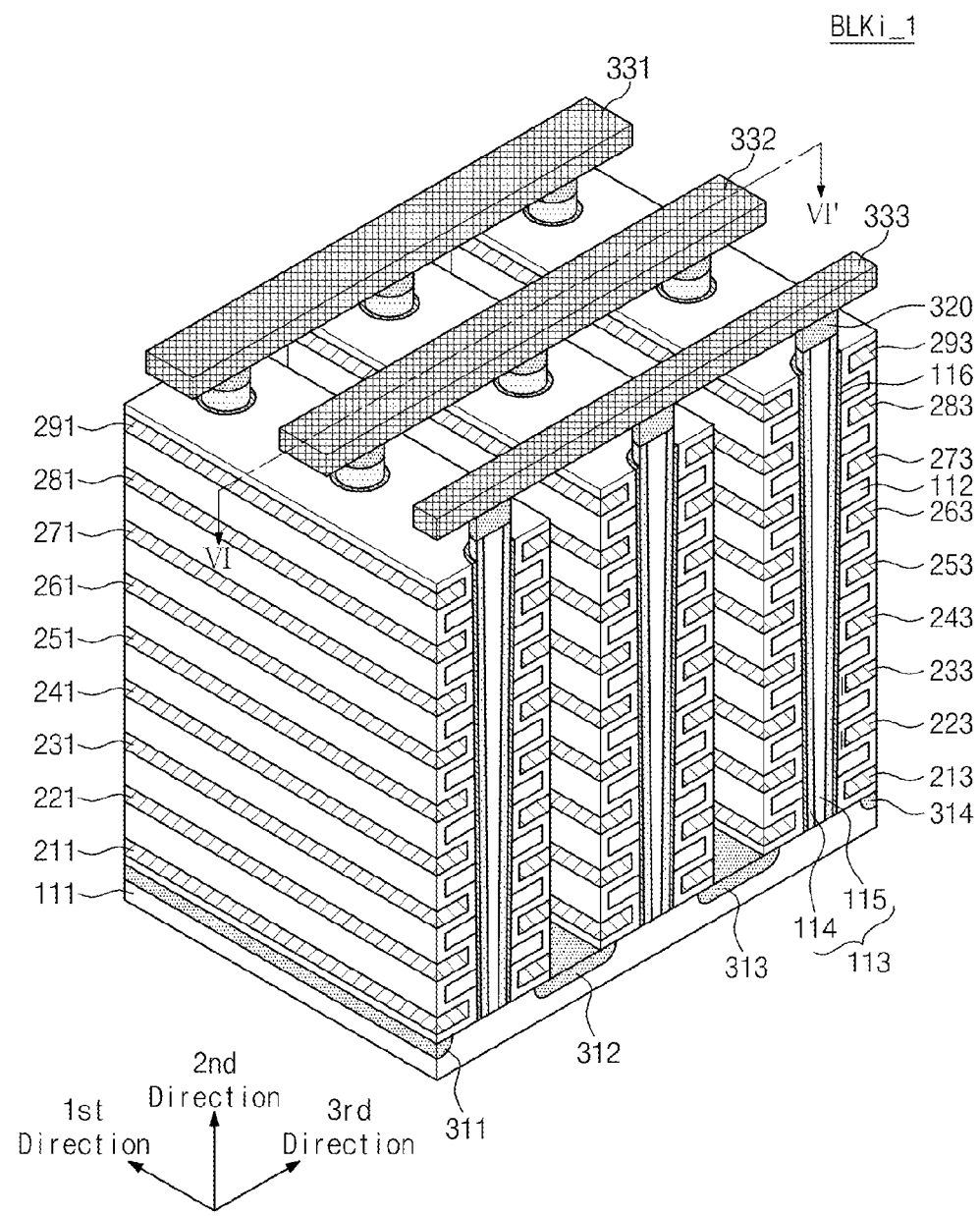
FIG. 5 is a perspective view illustrating an example memory block BLKi_1 corresponding to the memory block BLKi of FIG. 4.
Figure 6:
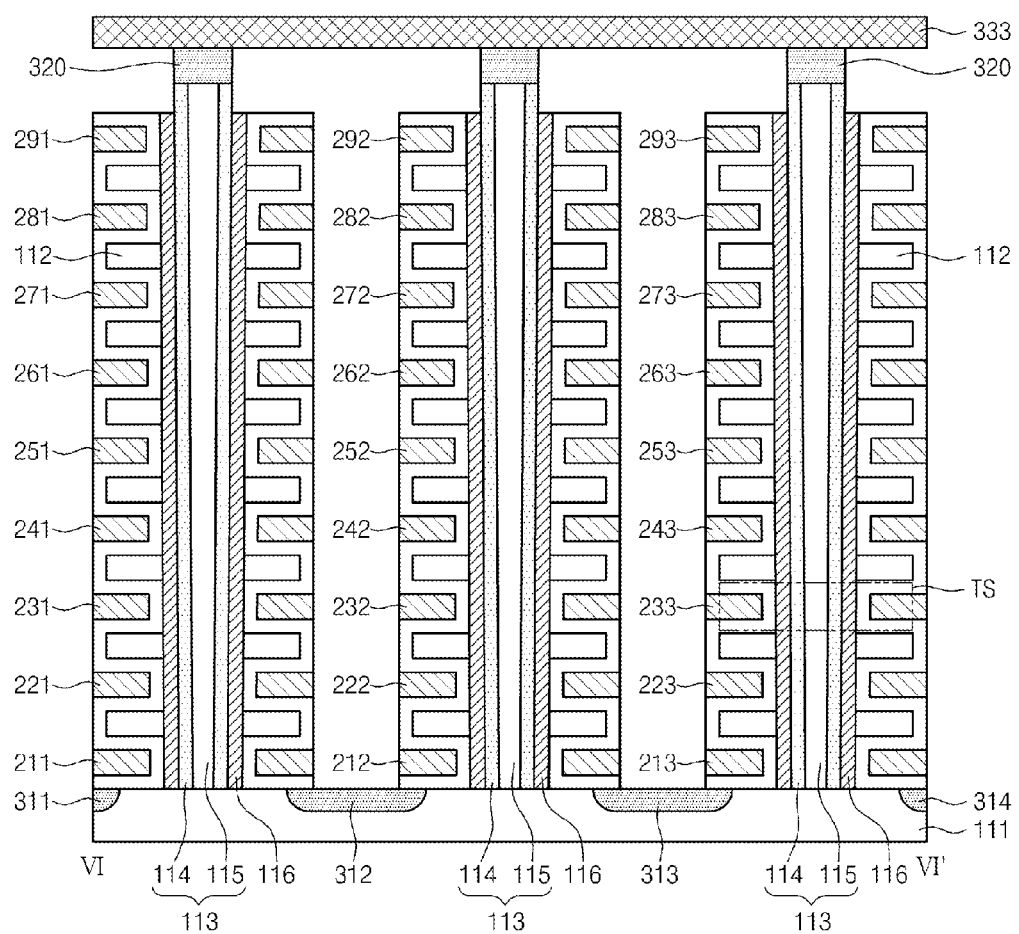
FIG. 6 is a cross sectional view taken along the line VI-VI' of the memory block BLKi_1.

FIG. 5 is a perspective view illustrating an example memory block BLKi_1 corresponding to the memory block BLKi of FIG. 4. FIG. 6 is a cross sectional view taken along the line VI-VI' of the memory block BLKi_1. Referring to FIGS. 5 and 6, the memory block BLKi_1 includes structures extending along first through third directions.

A substrate 111 may be provided. The substrate 111 may include a semiconductor material and may be doped with at least one impurity. For example, the substrate 111 may include a silicon material doped with a first type impurity. For example, the substrate 111 may include a silicon impurity doped with a p type impurity. The substrate 111 may be a p type well (for example, a pocket p well). It is assumed that the substrate 111 is p type silicon. However, the substrate 111 is not limited to p type silicon.

A plurality of doping region 311~314 extending along the first direction may be provided on the substrate 111. The doping regions 311~314 may have a second type impurity that is different from the first type impurity in the substrate 111. For example, the doping regions 311~314 may have an n type impurity. An example where the doping regions 311~314 are n type is discussed below. However, the doping regions 311~314 is not limited to an n type.

A plurality of insulating materials 112 extending along the first direction may be sequentially provided along the second direction on the corresponding substrate 111 between the first and second doping regions 311 and 312. For example, the insulating materials 112 and the substrate 111 may be provided to be spaced a desired (and/or alternatively predetermined) distance apart from one another along the second direction. For example, the insulating materials 112 may be provided to be spaced a desired (and/or alternatively predetermined) distance apart from the second direction. The insulating materials 112 may include silicon oxide.

A plurality of pillars 113 that are sequentially disposed along the first direction and penetrates through the insulating materials 112 along the second direction may be provided on the corresponding substrate 111 between the first and second doping regions 311 and 312. Each pillar 113 penetrates the insulating materials 112 to be connected to the substrate 111.

Each pillar 113 may be constituted by a plurality of materials. For example, a surface layer 114 of each pillar 113 may include silicon material doped with a first type. That is, the surface layer 114 of each pillar 113 may include silicon material doped with the same type as the substrate 111. It is assumed that the surface layer 114 of each pillar 113 includes p-type silicon. However, the surface layer 114 of each pillar 113 is not limited to include p type silicon.

An internal layer 115 of each pillar 113 may be constituted by an insulating material. For example, the internal layer 115 of each pillar 113 includes silicon oxide.

An insulating layer 116 that may be sequentially disposed along the first direction and extends along the second direction may be provided on the corresponding substrate 111 between the pillar 113 and the insulating materials 112.

Conductive materials 211~291 may be provided on a region between the first and second doping regions 311 and 312. For example, the conductive material 211 extending along the first direction may be provided between the substrate 111 and the insulating material 112 adjacent to the substrate 111.

Among the insulating materials 112, a conductive material extending along the first direction may be provided between a top surface of a specific insulating material and a bottom surface of an insulating material disposed on the upper portion of the specific insulating material. A plurality of conductive materials 221~281 extending along the first direction may be provided among the insulating materials 112. A conductive material 291 extending along the first direction may be also provided on a region on the insulating materials 112. The conductive materials 221~291 extending along the first direction may be a metal material. The conductive materials 221~291 extending along the first direction may be a conductive material such as polysilicon.

A structure that is the same as the structure on the first and second doping regions 311 and 312 may be provided between the second and third doping regions 312 and 313. The insulating materials 112 extending along the first direction, the pillars 113 and the insulating layer 116 that are sequentially disposed along the first direction and penetrate the insulating materials 112 along the second direction and conductive materials 212~292 extending along the first direction may be provided on a region between the second and third doping regions 312 and 313.

A structure which is the same as the structure on the first and second doping regions 311 and 312 may be provided between the third and fourth doping regions 313 and 314. The insulating materials 112 extending along the first direction, the pillars 113 and the insulating layer 116 that are sequentially disposed along the first direction and penetrate the insulating materials 112 along the second direction and conductive materials 213~293 extending along the first direction may be provided on a region between the third and fourth doping regions 313 and 314.

Drains 320 may be provided on the pillars 113 respectively. The drain 320 may be silicon material doped with a second type. For example, the drain 320 may be silicon material doped with an n type. It is assumed that the drain 320 includes n-type silicon. However, the drain 320 is not limited to include n-type silicon. A width of the drain 320 may be greater than a width of the corresponding pillar 113. For example, each drain 320 may be provided on a top surface of the corresponding pillar 113 in a pad form.

Conductive materials 331~333 extending along the third direction may be provided on the drains 320. The conductive materials 331~333 are sequentially disposed along the first direction. Each of the conductive materials 331~333 may be connected to the corresponding drain 320. The drains 320 and the conductive materials 331~333 along the third direction can be connected to one another through contact plugs. The conductive materials 331~333 may be metal materials. The conductive materials 331~333 may be conductive materials such as polysilicon.

In FIGS. 5 and 6, each pillar 113 may form a cell string CS together with the insulating layer 116 and the conductive lines 211~291, 212~292 and 213~293. The cell strings CS includes a plurality of transistor structures TS. The transistor structure TS will be described in further detail with reference to FIG. 7.

The memory block BLKi_1 includes a plurality of pillars 113. That is, the memory block BLKi_1 includes a plurality of cell strings CS. The memory block BLKi_1 includes a plurality of cell strings CS extending in the second direction (or a direction perpendicular to the substrate 111).

Each cell string CS includes a plurality of transistor structures TS being disposed along the second direction. At least one of the transistor structures TS of each cell string CS may operate as a string select transistor SST. At least one of the transistor structures TS of each cell string CS may operate as a ground select transistor GST.

Gates (or control gates) correspond to the conductive lines 211~291, 212~292 and 213~293 extending along the first direction. That is, the gates extend in the first direction to form at least two select lines (for example, at least one string select line SSL and at least one ground select line GSL).

The conductive materials 331~333 extending along the third direction may be connected to one end of the cell strings CS. The conductive materials 331~333 operate as bit lines BL. That is, in one memory block BLKi_1, a plurality of cell strings CS may be connected to one bit line.

The second type doping regions 311~314 extending in the first direction may be provided to the other end of the cell strings CS. The second type doping regions 311~314 operate as common source lines CSL.

The memory block BLKi_1 includes a plurality of NAND strings extending in the second direction and operates as a NAND flash memory block (for example, a charge trap type) in which a plurality of cell strings CS may be connected to one bit line BL.

In FIGS. 4 and 5, conductive lines extending in the first direction may be provided to eight layers, sixteen layers or a plurality of layers. That is, in one cell string, the number of transistors may be 8, 16 or the plural number.

In FIGS. 4 and 5, in the memory block BLKi_1, m number of cell strings CS may be connected to one bit line BL. The number of conductive lines 211~291, 212~292 and 213~293 and the common source lines 311~314 may be controlled as many as the number of cell strings CS connected to one bit line BL.

In FIGS. 4 and 5, n number of cell strings CS may be connected to one conductive material extending in the first direction. The number of bit lines 331~333 may be controlled as many as the number of cell strings CS connected to one conductive material extending in the first direction.

As illustrated in FIGS. 4 and 5, a width of the pillar 113 may be changed depending on a height of the memory cell MC. A width of the pillar 113 may be changed due to the nature or error of the process. As a height of the memory cell MC may be reduced and a distance between a string select line SSL and a word line WL increases, a width of the pillar 113 may be reduced.

Figure 7:
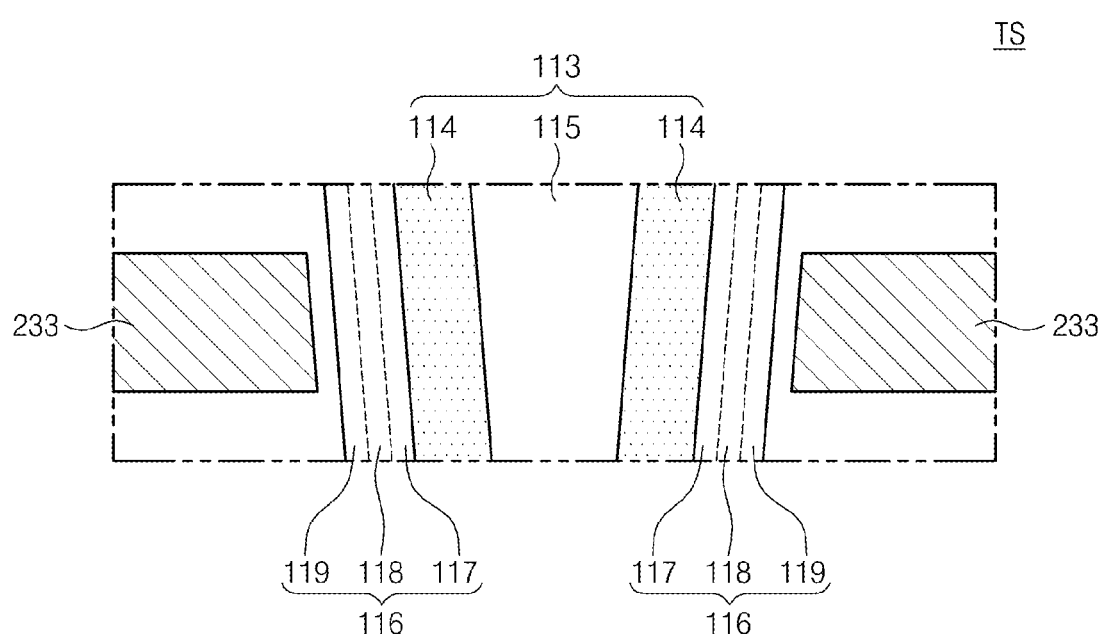
FIG. 7 is a cross sectional view illustrating a transistor structure TS of FIG. 6.

FIG. 7 is a cross sectional view illustrating a transistor structure TS of FIG. 6. Referring to FIGS. 5 through 7, the insulating layer 116 includes at least three sub insulating layers 117, 118 and 119.

The p-type silicon 114 of the pillar 113 operates as a body. The first sub insulating layer 117 adjacent to the pillar 113 operates as a tunneling insulating layer. For example, the first sub insulating layer 117 adjacent to the pillar 113 includes a thermal oxide layer.

The second sub insulating layer 118 operates as a charge storage layer. For example, the second sub insulating layer 118 operates as a charge capture layer. For example, the second sub insulating layer 118 includes a nitride layer or a metal oxide layer (for example, an aluminum oxide layer, a hafnium oxide layer, etc.).

The third sub insulating layer 119 adjacent to the conductive material 233 operates as a blocking insulating layer. The third sub insulating layer 119 adjacent to the conductive material 233 may be formed to be a single layer or a multiple layer. The third sub insulating layer 119 may be a high dielectric layer (for example, an aluminum oxide layer, a hafnium oxide layer, etc.) having a dielectric constant higher than the first and second sub insulating layers 117 and 118.

The conductive material 233 operates as a gate (or a control gate). That is, the gate 233, the blocking insulating layer 119, the charge storage layer 118, the tunneling insulating layer 117 and the body 114 form a transistor (or a memory cell transistor structure). The third through third sub insulating layers 117~119 may constitute an ONO (oxide-nitride-oxide). Hereinafter the p-type silicon 114 of the pillar 113 may be called a body of a second direction.

The pillar 113 includes a silicon oxide layer 117 that operates as a tunneling insulating layer, a silicon nitride layer 118 that operates as a charge storage layer and a silicon oxide layer 119 that operates as a blocking insulating layer. An electric field may be formed between the gate and the body 114 due to a voltage difference between the gate and the body 114. The electric field may be distributed to the tunneling insulating layer 117, the charge storage layer 118 and the blocking insulating layer 119.

An electric field distributed to the tunneling insulating layer 117 causes a Fowler-Nordheim tunneling. That is, the memory cell MC may be programmed or erased by an electric field being distributed to the tunneling layer 117. The amount of charges being captured in the charge storage layer 118 in a program operation or the amount of charges flowing into the charge storage layer 118 in an erase operation may be determined depending on an electric field being distributed to the tunneling insulating layer 117.

The electric field may be distributed to the tunneling insulating layer 117, the charge storage layer 118 and the blocking insulating layer 119 based on capacitance of each of the tunneling insulating layer 117, the charge storage layer 118 and the blocking insulating layer 119. As a width of the pillar 113 is reduced, an area ratio of the tunneling insulating layer 117 to the blocking insulating layer 119 may be reduced. Accordingly, a ratio of capacitance of the tunneling insulating layer 117 to capacitance of the blocking insulating layer 119 may be reduced. As the ratio of capacitance of the tunneling insulating layer 117 to capacitance of the blocking insulating layer 119 may be reduced, an electric field being distributed to the tunneling insulating layer 117 increases.

Thus, as a width of the pillar 113 is reduced, the amount of charges being captured in the charge storage layer 118 in a program operation and the amount of charges flowing into the charge storage layer 118 in an erase operation increase. That is, due to a difference of a width of the pillar 113, magnitude of a tunneling effect is changed and the amount of threshold voltage variation of the memory cells MC1~MC6 is changed in a program operation or an erase operation. To compensate a difference of a tunneling effect (or amount of threshold voltage variation) caused by a change of a width of the pillar 113, levels of the word line voltages may be controlled.

Figure 8:
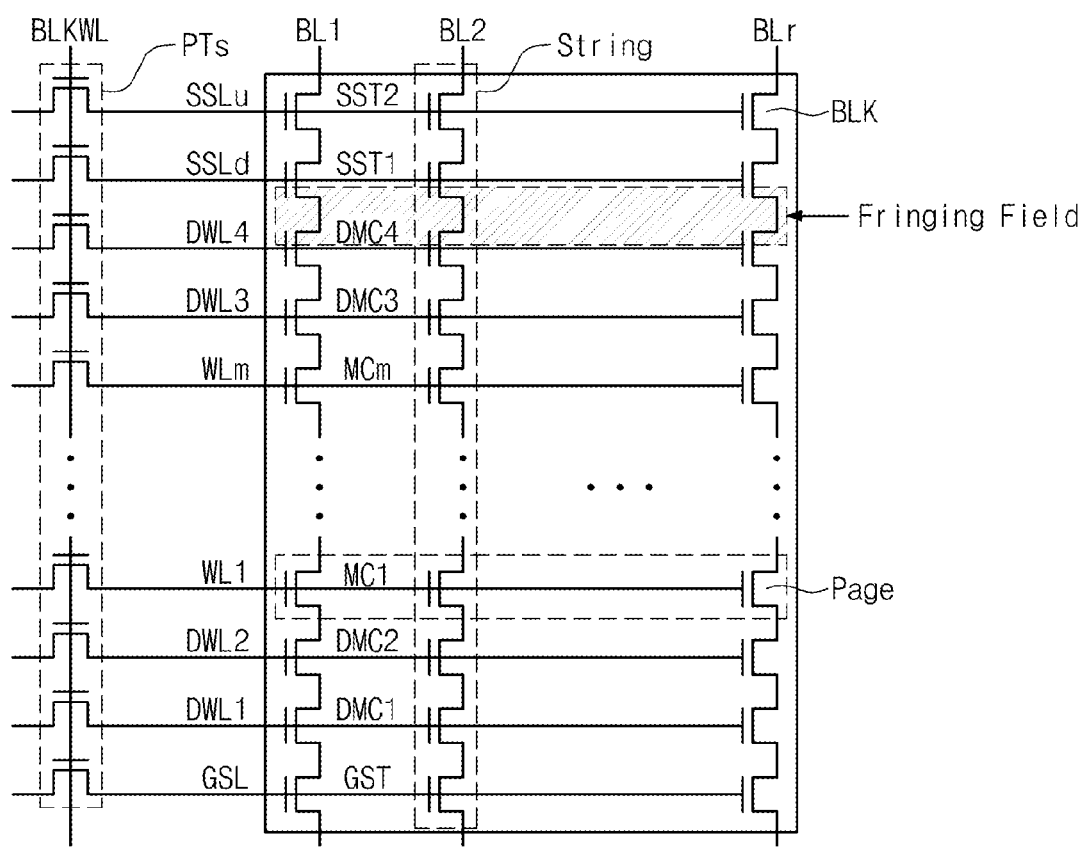
FIG. 8 is a circuit for explaining a hole trap that occurs in an erase operation in accordance with example embodiments of inventive concepts.

FIG. 8 is a circuit for explaining a hole trap that occurs in an erase operation in accordance with example embodiments of inventive concepts. Referring to FIG. 8, a memory block BLK includes a plurality of strings connected to a plurality of bit lines BL1~BLr (r is an integer which is two or more). For the purposes of description, it is assumed that one string includes two string select transistors SST1 and SST2 and four dummy memory cells DMC1~DMC4.

Each string may include the string select transistors SST1 and SST2, the dummy memory cells DMC1~DMC4, a plurality of memory cells MC1~MCm (m is an integer which is two or more) and at least one ground select transistor GST. Each of the memory cells MC1~MCm can store data of one or more bits.

A plurality of memory cells may be connected to each of a plurality of word lines WL1~WLm. The memory cells connected to each of the word lines WL1~WLm are called page. Word line voltages (for example, a program voltage, a pass voltage, a read voltage, a voltage pass voltage, etc.) needed to drive the memory cells may be applied to each of the word lines WL1~WLm. Program and read operations are performed by a page unit.

The string select transistors SST1 and SST2 may be connected to string select lines SSLd and SSLu respectively. A string select voltage for controlling the string select transistors SST1 and SST2 may be applied to the string select lines SSLd and SSLu.

At least one ground select transistor GST may be connected to a ground select line GSL. A ground select voltage for controlling at least one ground select transistor GST may be applied to the ground select line GSL.

A plurality of pass transistors PTs may be connected to the memory block BLK. The pass transistors PTs may be connected to a block word line BLKWL. The pass transistors PTs can connect source lines (not illustrated) to the word lines WL1~WLm in response to a voltage applied to the block word line BLKWL. Each of the pass transistors PTs may be a high voltage transistor.

An erase operation may be performed by a block unit. Referring to FIG. 8, in an erase operation, the string select lines SSLd and SSLu may be floated. A word line erase voltage may be applied to second through fourth dummy word lines DWL2~DWL4 and the word lines WL1~WLm. The word line erase voltage may be a word line erase voltage VSS. A first dummy word line DWL1 and the ground select line GSL may be floated. An erase voltage Vers may be applied to the substrate 111.

The substrate 111 and the channel layers 114 have the same conductivity type. Thus, an erase voltage Vers being applied to the substrate 111 may be transmitted to the channel layers 114. The erase voltage Vers may be a high voltage.

The ground select line GSL, the first dummy word line DWL1 and the string select lines SSLd and SSLu are in a floating state. Thus, when a voltage of the channel layers 114 is changed, the ground select line GSL, the first dummy word line DWL1 and the string select lines SSLd and SSLu undergo a coupling effect. That is, when a voltage of the channel layers 114 rises to the erase voltage Vers, voltages of the ground select line GSL, the first dummy word line DWL1 and the string select lines SSLd and SSLu may also rise. Thus, the ground select line GSL, the first dummy word line DWL1 and the string select lines SSLd and SSLu are erase-limited (and/or prevented).

A word line erase voltage VSS may be applied to the word lines WL1~WLm and the second through fourth dummy word lines DWL2~DWL4. A Fowler-Nordheim tunneling occurs in the memory cells MC1~MCm due to a voltage difference among the channel layers 114, the word lines WL1~WLm and the second through fourth dummy word lines DWL2~DWL4. Thus, the memory cells MC1~MCm and the second through fourth dummy memory cells DMC2~DMC4 are erased.

When erasing the dummy memory cell DMC4 connected to the fourth dummy word line DWL4 adjacent to the first string select line SSLd, holes may be trapped between the first string select transistor SST1 and the fourth dummy memory cell DMC4. This hole trap phenomenon may occur in the charge storage layer 118 of the insulating layer 116. A fringing field phenomenon that a hole trap occurs in a space of the charge storage layer 118 between the first string select transistor SST1 and the fourth dummy memory cell DMC4 may occur. Holes trapped by the fringing field may laterally spread to move to the first string select transistor SST1.

This may cause a phenomenon that a threshold voltage of the first string select transistor SST1 of the first string select line SSLd may be reduced. If a threshold voltage of the first select transistors SST1 may be reduced, a leakage current may occur in the first string select line SSLd. If a leakage current occurs, in a program operation, a boosting level of an unselect string may be reduced and thereby a program operation may be adversely affected.

Figure 9:
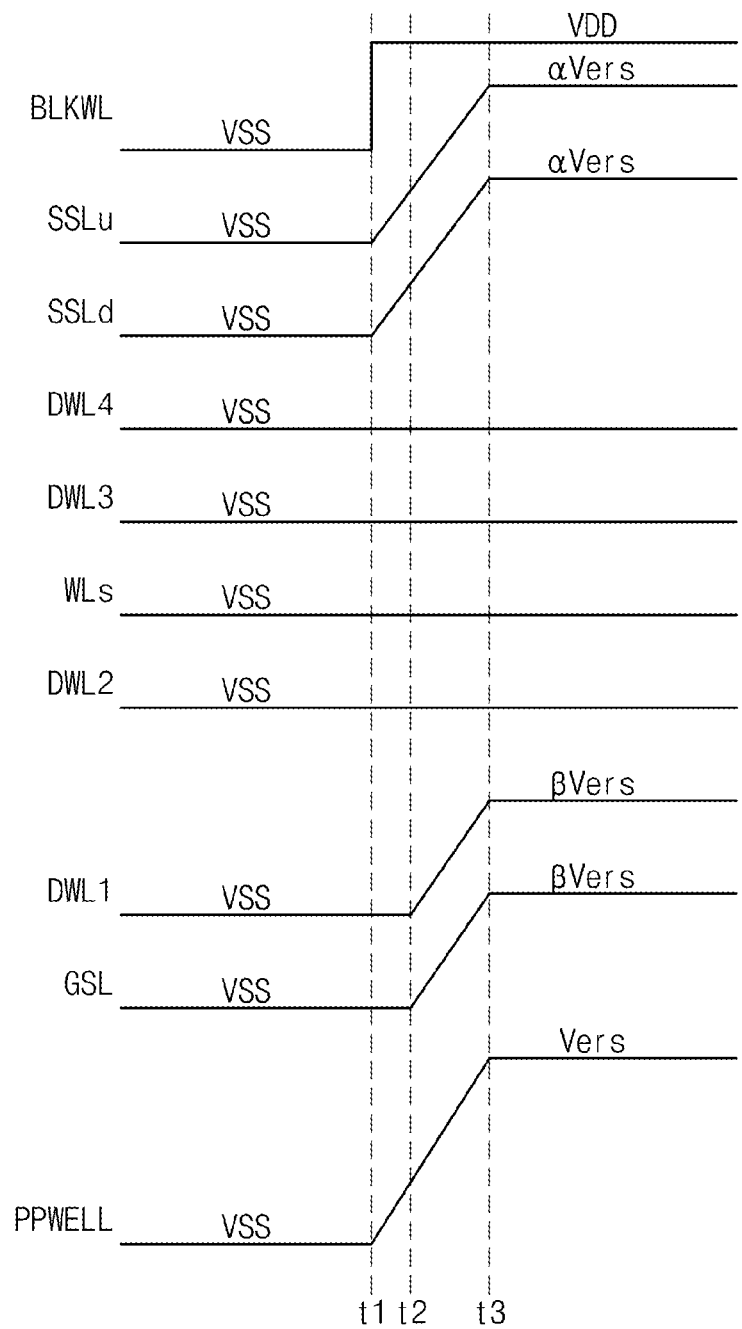
FIG. 9 is a timing diagram illustrating a voltage change in accordance with a general erase method.

FIG. 9 is a timing diagram illustrating a voltage change in accordance with a general erase method. Referring to FIGS. 8 and 9, at a first time (t1), a first turn-on voltage VDD may be applied to the block word line BLKWL. The first turn-on voltage may be a power supply voltage.

At the first time (t1), an erase voltage Vers may be applied to a substrate (e.g., PPWELL). If the erase voltage Vers is applied to the substrate PPWELL, the first and second string select lines SSLd and SSLu become a floating state. A voltage slope of the first and second string select lines SSLd and SSLu increases. A word line voltage VSS may be applied to the second through fourth dummy word lines DWL2~DWL4 and the word lines WL1~WLm.

At a second time (t2), the first dummy word line DWL1 and the ground select line GSL become a floating state. A voltage slope of the first dummy word line DWL1 and the ground select line GSL increases.

At a third time (t3), voltages of the first and second string select lines SSLd and SSLu rise to a first floating voltage αVers. Voltages of the first dummy word line DWL1 and the ground select line GSL rise to a second floating voltage βVers. The first floating voltage αVers may be higher than the second floating voltage βVers.

A voltage of the block word line BLKWL may be controlled to be higher than or equal to the voltages of the first and second string select lines SSLd and SSLu.

The rising slopes of the block word line BLKWL and the first and second string select lines SSLd and SSLu may be controlled to be smaller than a voltage slope of the substrate PPWELL.

The voltages of the first and second string select lines SSLd and SSLu, that is, the voltage rising slopes of the first and second string select lines SSLd and SSLu may be controlled so that the string select transistors SST1 and SST2 are not programmed. For example, the voltage rising slopes of the first and second string select lines SSLd and SSLu may be controlled so that the voltages of the first and second string select lines SSLd and SSLu are not higher than the voltage of the substrate PPWELL.

The voltages of the first and second string select lines SSLd and SSLu, that is, the voltage rising slopes of the first and second string select lines SSLd and SSLu may be controlled so that the string select transistors SST1 and SST2 are not erased. For example, the voltage rising slopes of the first and second string select lines SSLd and SSLu may be controlled so that the voltages of the first and second string select lines SSLd and SSLu are not lower than the voltage of the substrate PPWELL by more than a specific level.

The memory cells MC1~MCm may be erased by a voltage difference between the word line erase voltage VSS being applied to the word lines WLs and the erase voltage Vers being applied to the substrate PPWELL. If using the erase method described above, a space of the charge storage layer 118 between the fourth dummy memory cell DMC4 and the first string select transistor SST1 traps a lot of holes due to the fringing field phenomenon. Thus, the trapped holes may move to the first string select transistor SST1 to reduce a threshold voltage. Because of this, in a program operation, a deterioration phenomenon of distribution may occur.

Figure 10:
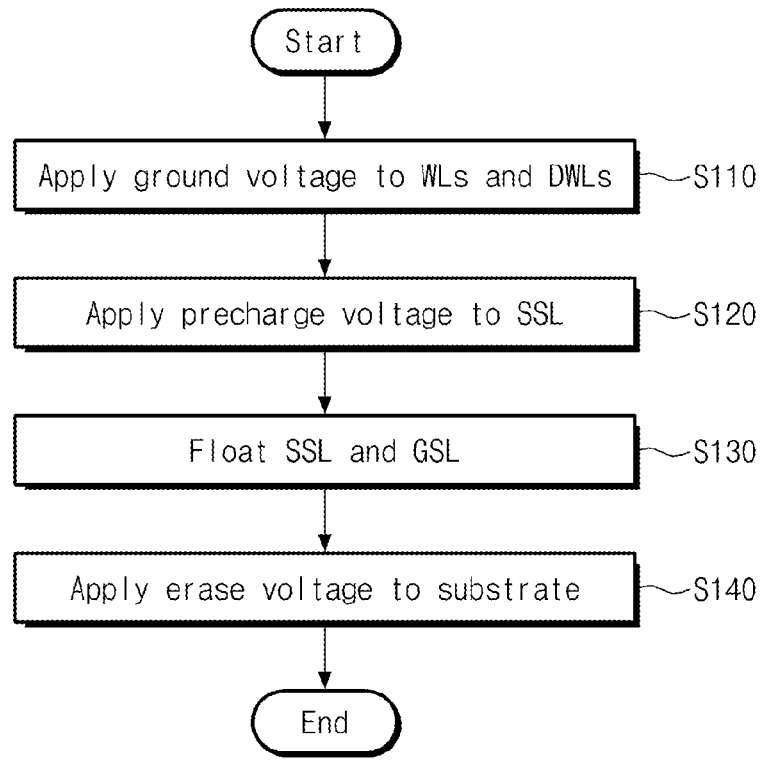
FIG. 10 is a flow chart for explaining an erase method in accordance with example embodiments of inventive concepts.

FIG. 10 is a flow chart for explaining an erase method in accordance with example embodiments of inventive concepts. Referring to FIGS. 8 and 10, in an operation S110, the word line erase voltage (e.g., ground voltage VSS) may be applied to the word lines WLs and the dummy word lines DWL2~DWL4. In an operation S120, a precharge voltage Vpre may be applied to the string select line SSL. In an operation S130, the string select line SSL and the ground select line GSL may be floated. In an operation S140, the erase voltage Vers may be applied to the substrate PPWELL.

In an erase operation, a lateral spreading phenomenon of holes may occur. If a lot of holes move from the fourth dummy memory cell DMC4 to the string select transistor SST due to the lateral spreading phenomenon, a threshold voltage of the string select line SSL may be reduced. If the threshold voltage of the string select line SSL is reduced, in a program operation, a boosting level may be reduced due to a leakage current of the string select line SSL. Thus, a program operation is not well performed.

By precharging the string select line SSL according to example embodiments of inventive concepts, the amount of holes being trapped in the string select transistor SST may be reduced.

Figure 11:
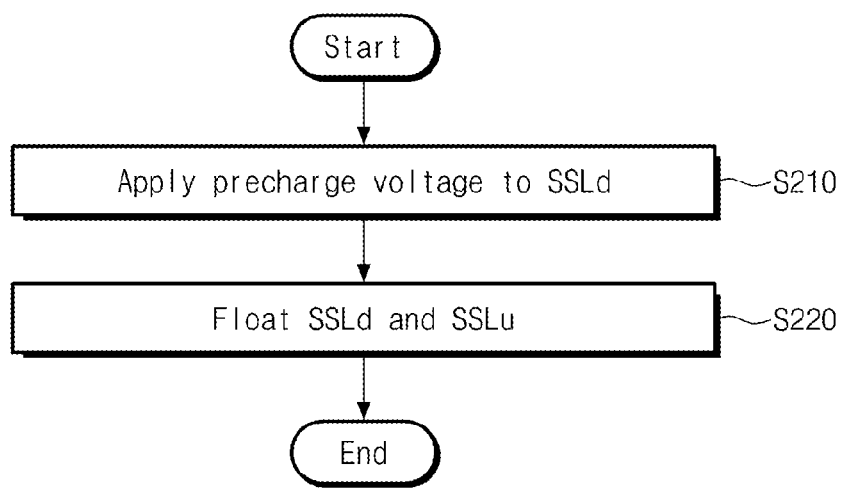
FIG. 11 is a flow chart illustrating a voltage control method of a plurality of string select lines in accordance with example embodiments of inventive concepts.

FIG. 11 is a flow chart illustrating a voltage control method of a plurality of string select lines in accordance with example embodiments of inventive concepts. Referring to FIGS. 8, 10 and 11, in an operation S210, the precharge voltage Vpre is applied to the first string select line SSLd. In an operation S220, the first and second string select lines SSLd and SSLu are floated. After the precharge voltage Vpre is applied, the first string select line SSLd is floated. Accordingly, a voltage of the first string select line SSLd rises to a third floating voltage (Vpre+αVers).

The erase method according to example embodiments of inventive concepts reduces the amount of holes being trapped by precharging the first string select line SSLd. Specifically, the precharge voltage Vpre is applied to the first string select line SSLd during a desired (and/or alternatively predetermined) time in an erase operation and then the first string select line SSLd may be floated. The third floating voltage (Vpre+αVers) may applied to the first string select line SSLd. Thus, a voltage higher than the second string select line SSLu may be applied to the first string select line SSLd.

Figure 12:
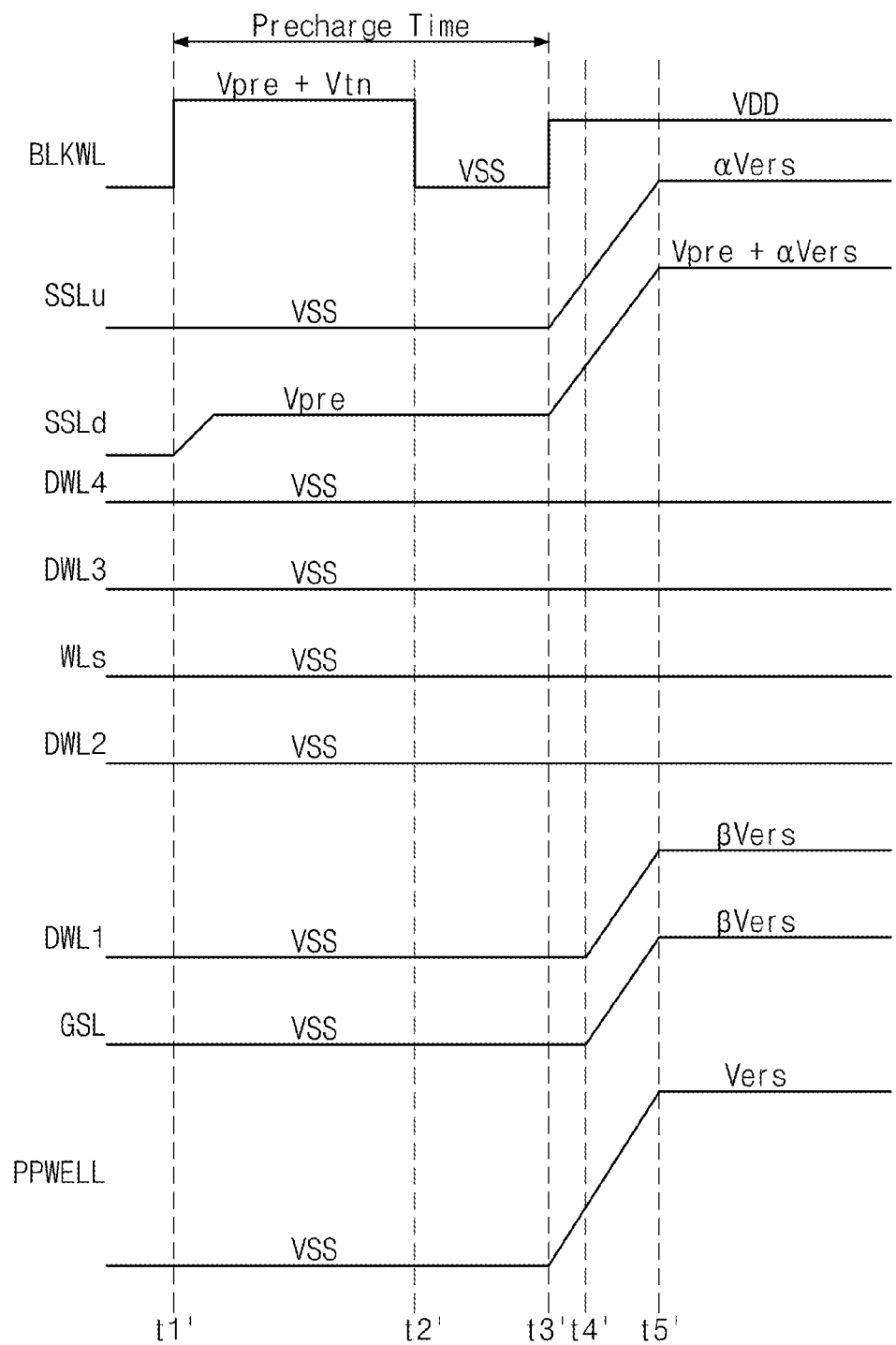
FIG. 12 is a timing diagram illustrating a voltage change of an erase method in accordance with example embodiments of inventive concepts.

FIG. 12 is a timing diagram illustrating a voltage change of an erase method in accordance with example embodiments of inventive concepts. Referring to FIGS. 4 through 12, at a first time (t1'), a second turn-on voltage Vpre+Vtn may be applied to the block word line BLKWL. The precharge voltage Vpre may be applied to the first string select line SSLd. Because of this, the first string select line SSLd may be precharged to the precharge voltage Vpre before an erase operation. The second turn-on voltage Vpre+Vtn may be a voltage obtained by adding the precharge voltage Vpre to a gate threshold voltage Vtn of the select transistors PTs to apply the precharge voltage Vpre to the first string select line SSLd.

At a second time (t2'), the voltage of the block word line BLKWL may be reduced to the word line erase voltage VSS.

At a third time (t3'), the first turn-on voltage VDD may be applied to the block word line BLKWL. The erase voltage Vers may be applied to the substrate PPWELL. The first and second string select lines SSLd and SSLu become a floating state. Thus, voltage of the first and second string select lines SSLd and SSLu rise according to the erase voltage Vers applied to the substrate PPWELL. A precharge time that the first string select line SSLd may be precharged may be from the first time (t1') to the third time (t3').

At a fourth time (t4'), the first dummy word line DWL1 and the ground select line GSL become a floating state. Voltages of the first dummy word line DWL1 and the ground select line GSL rise according to the erase voltage Vers applied to the substrate PPWELL.

At a fifth time (t5'), a voltage of the second string select line SSLu reaches the first floating voltage αVers. A voltage of the first string select line SSLd reaches the third floating voltage Vpre+αVers. The third floating voltage Vpre+αVers may be a voltage obtained by increasing the precharge voltage Vpre by the first floating voltage αVers. A voltage level of the first string select line SSLd may be controlled to be higher than a voltage level of the second string select line SSLu.

At a fifth time (t5'), voltages of the first dummy word line DWL1 and the ground select line GSL reach the second floating voltage βVers. A voltage of the substrate PPWELL reaches the erase voltage Vers. The floating voltage may be controlled so that the string select transistors SST1 and SST2 are not erased due to a voltage difference between the first floating voltage VDD and the erase voltage Vers. For example, the floating voltage may be controlled to have a level within a specific range based on ½ level of the erase voltage Vers.

The memory cells MC1~MCm are erased by a voltage difference between the word line erase voltage VSS being applied to the word lines WLs and the erase voltage Vers being applied to the substrate PPWELL.

Referring to FIGS. 8 and 12, the first string select line SSLd may be precharged to the precharge voltage Vpre. Because of this, in an erase operation, holes being trapped in the charge storage layer 118 between the fourth dummy memory cell DMC4 and the first string select transistor SST1 may be reduced. Specifically, holes being trapped from the fourth dummy memory cell DMC4 to the first string select transistor SST1 may be reduced. Holes being trapped may be reduced by applying the third floating voltage Vpre+αVers higher than the first floating voltage αVers to the first string select line SSLd. Thus, a lateral spreading phenomenon that holes being trapped spread to the first string select transistor SST1 may be reduced.

Figure 13:
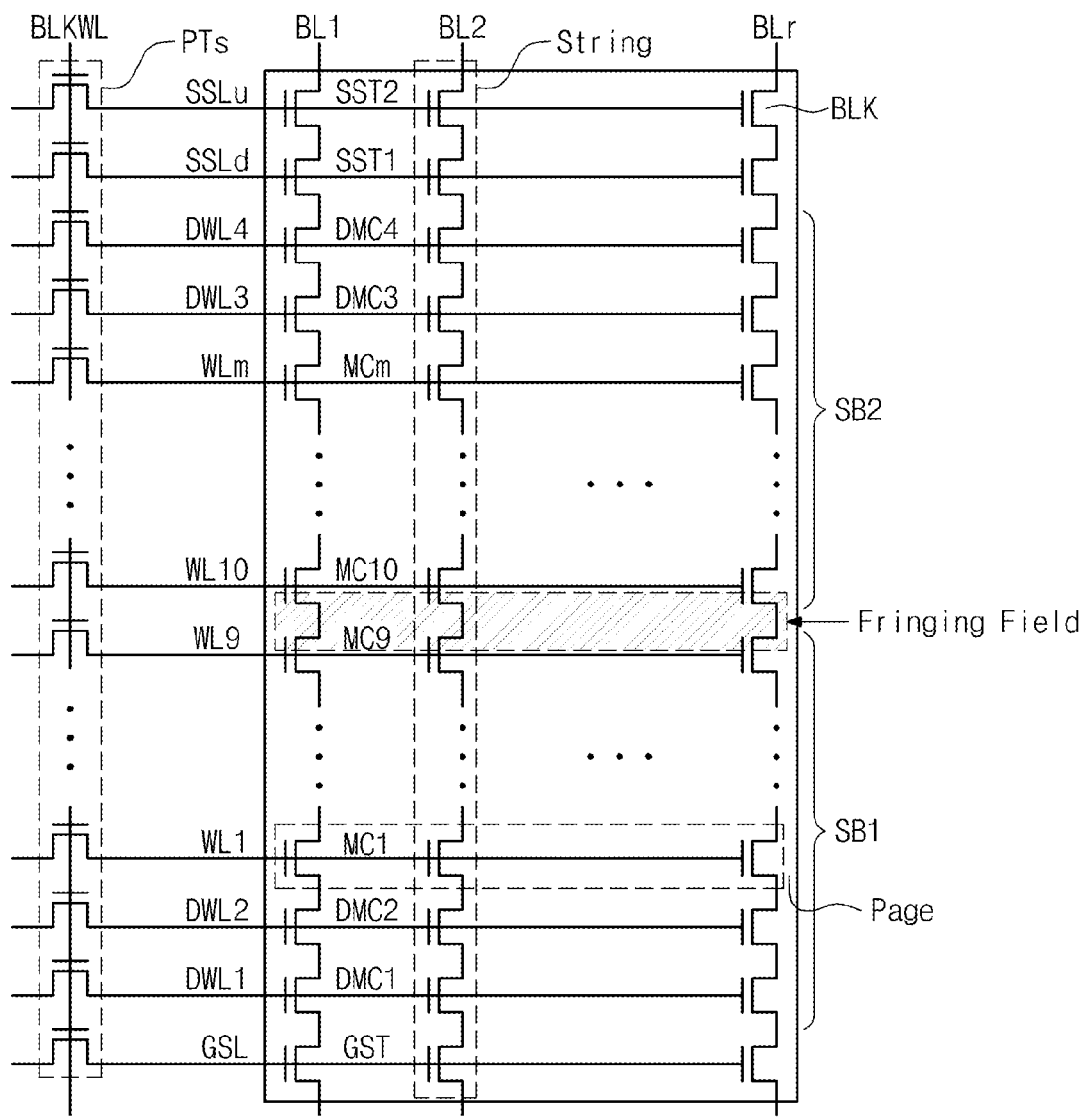
FIG. 13 is a circuit for explaining a hole trap that occurs in an erase operation in accordance with example embodiments of inventive concepts.

FIG. 13 is a circuit for explaining a hole trap that occurs in an erase operation in accordance with example embodiments of inventive concepts. Referring to FIGS. 7, 8 and 13, a memory block BLK may be divided into sub blocks SB1 and SB2. For purposes of description, it is assumed that the memory block BLK may be divided into sub blocks SB1 and SB2. The sub blocks SB1 and SB2 can be erased independently of each other in the memory block BLK.

The first sub block SB1 may include memory cells connected to first and second dummy word lines DWL1 and DWL2 and memory cells connected to first through ninth word lines WL1~WL9. The second sub block SB2 may include memory cells connected to third and fourth dummy word lines DWL3 and DWL4 and memory cells connected to tenth through mth word lines WL10~WLm. Dummy memory cells DMCs connected to at least one dummy word line DWL may exist between the first and second sub blocks SB1 and SB2.

When an erase operation is performed on the first sub block SB1, the first sub block SB1 may be called a selected sub block. The unerased second sub block SB2 may be called an unselected sub block.

When erasing the first sub block SB1, a fringing field phenomenon that a hole trap phenomenon occurs may occur in the charge storage layer 118 between ninth through tenth memory cells MC9 and MC10. In an operation, a lot of holes may be trapped from memory cells connected to the ninth word line WL9. Threshold voltages of memory cells connected to the tenth word line WL10 may be reduced according to a lateral spreading phenomenon that trapped holes move to the memory cells connected to the tenth word line WL10.

Figure 14:
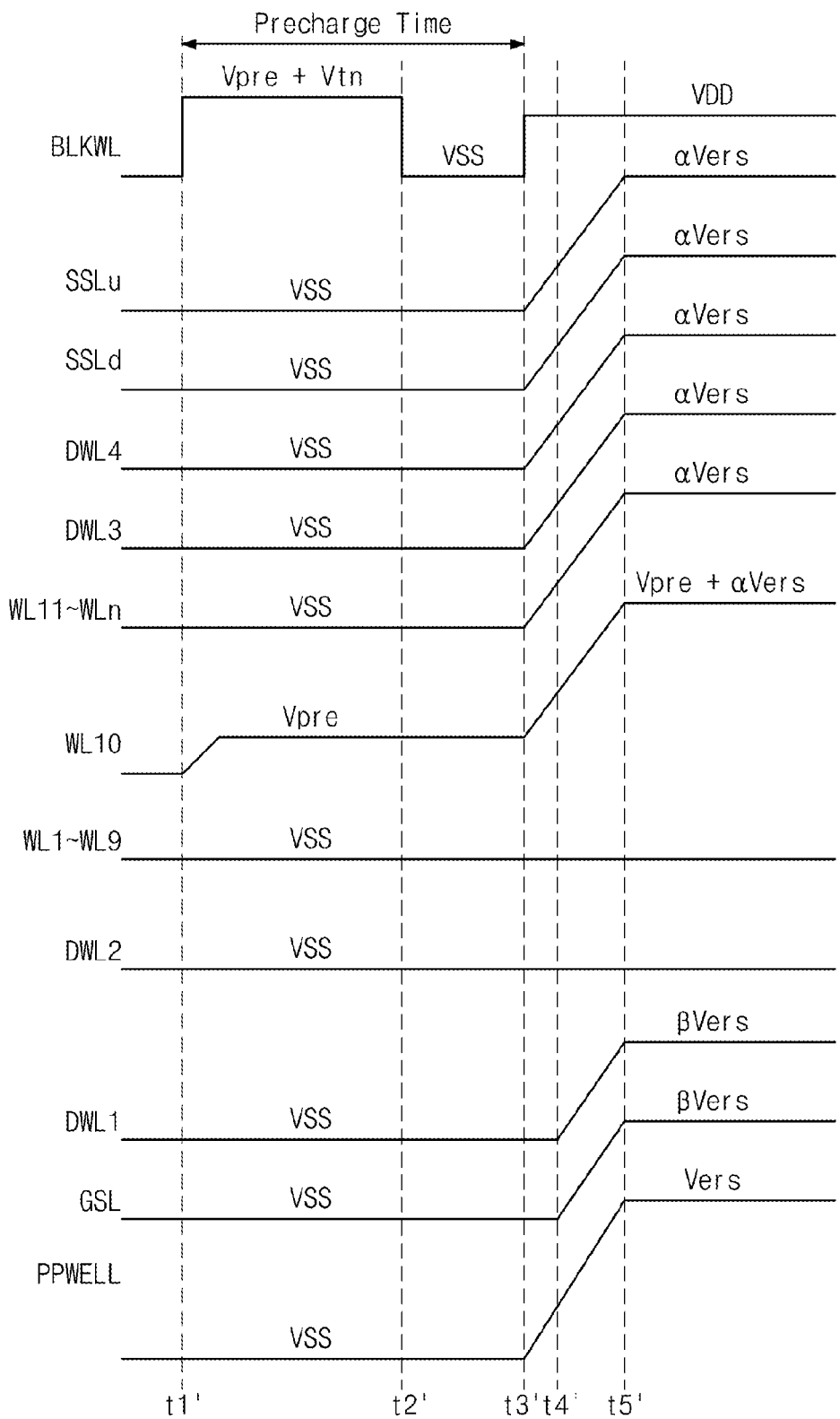
FIG. 14 is a timing diagram illustrating a voltage change of an erase method in accordance with example embodiments of inventive concepts.

FIG. 14 is a timing diagram illustrating a voltage change of an erase method in accordance with example embodiments of inventive concepts. Referring to FIGS. 12 through 14, when performing an erase operation on the first sub block SB1, a timing diagram of a voltage being applied to limit and/or prevent a hole trap is illustrated.

At a first time (t1'), the second turn-on voltage Vpre+Vtn may be applied to the block word line BLKWL. The precharge voltage Vpre may be applied to the tenth word line WL10. The second turn-on voltage Vpre+Vtn may be a voltage obtained by adding the precharge voltage Vpre to a gate threshold voltage Vtn of the select transistors PTs of the block word line BLKWL to apply the precharge voltage Vpre to the tenth word line WL10.

At a second time (t2'), a voltage of the block word line BLKWL may be reduced to the word line erase voltage VSS.

At a third time (t3'), the first turn-on voltage VDD may be applied to the block word line BLKWL. The string select lines SSLd and SSLu, the third and fourth dummy word lines DWL3 and DWL4 and the tenth through mth word lines WL11~WLm are floated. An erase voltage Vers may be applied to the substrate PPWELL. As an erase voltage Vers may be applied to the substrate PPWELL, voltages of the string select lines SSLd and SSLu, the third and fourth dummy word lines DWL3 and DWL4 and the tenth through mth word lines WL11~WLm are increased. A precharge time that the tenth word line WL10 is precharged may be from the first time (t1') to the third time (t3').

At a fourth time (t4'), the first dummy word line DWL1 and the ground select line GSL are floated. As the erase voltage Vers is applied to the substrate PPWELL, voltages of the first dummy word line DWL and the ground select line GSL rise.

At a fifth time (t5'), voltages of the string select lines SSLd and SSLu reach the first floating voltage αVers. The eleventh through mth word lines WL11~WLm reaches the first floating voltage αVers. The tenth word line WL10 reaches the third floating voltage Vpre+αVers. The third floating voltage Vpre+αVers may be a voltage obtained by adding the first floating voltage αVers to the precharge voltage Vpre.

At the fifth time (t5'), voltages of the first dummy word line DWL1 and the ground select line GSL reach the second floating voltage βVers. A voltage of the substrate PPWELL reaches the erase voltage Vers.

In an erase operation, the first sub block SB1 may be erased. The tenth word line WL10 most adjacent to the first sub block SB1 limits and/or prevents a lateral spreading phenomenon by applying the precharge voltage Vpre. Specifically, by applying the precharge voltage Vpre, a voltage of the tenth word line WL10 rises to the third floating voltage Vpre+αVers higher than the first floating voltage αVers. Thus, the amount of holes being trapped between memory cells connected to the ninth word line WL9 and memory cells connected to the tenth word line WL10 may be reduced.

Figure 15:
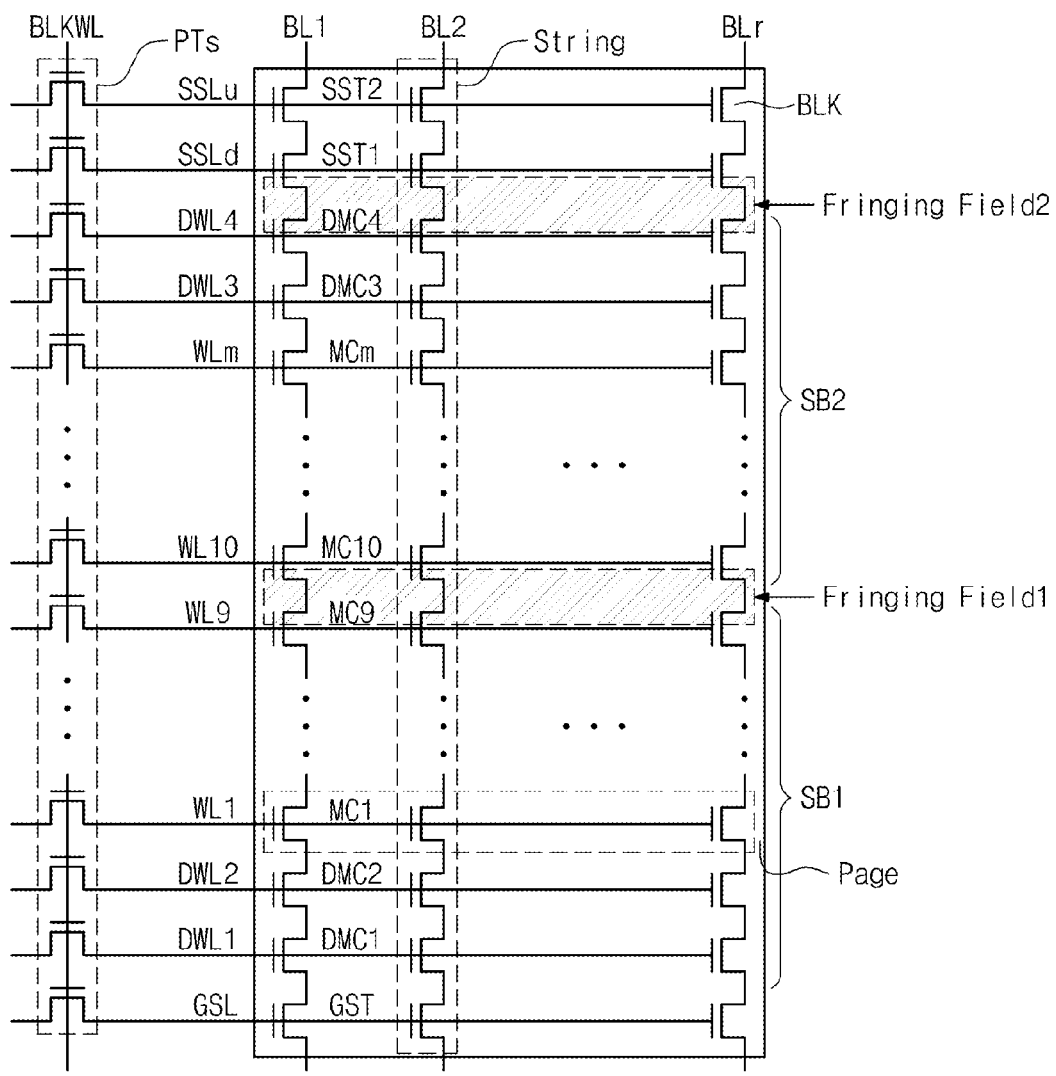
FIG. 15 is a circuit for explaining a hole trap that occurs in an erase operation in accordance with example embodiments of inventive concepts.

FIG. 15 is a circuit for explaining a hole trap that occurs in an erase operation in accordance with example embodiments of inventive concepts. Referring to FIGS. 7, 8 and 12 through 15, when an erase operation is performed on the second sub block SB2, the second sub block SB2 is called a selected sub block. The unerased first sub block SB1 may be called an unselected sub block.

When the second sub block SB2 is erased, a hole trap phenomenon may occur in the charge storage layer 118 between memory cells connected to the ninth word line WL9 and memory cells connected to the tenth word line WL10. A hole trap phenomenon may also occur in the charge storage layer 118 between the fourth dummy memory cell DMC4 and the first string select transistor SST1.

In an erase operation, a lot of holes may be trapped from the memory cells connected to the tenth word line WL10. Threshold voltages of the memory cells connected to the ninth word line WL9 may be reduced according to a lateral spreading phenomenon that the trapped holes move to the memory cells connected to the ninth word line WL9. A lot of holes from fourth dummy memory cell DMC4 connected to the fourth dummy word line DWL4 may be trapped in the first string select transistor SST1 connected to the first string select line SSLd.

Figure 16:
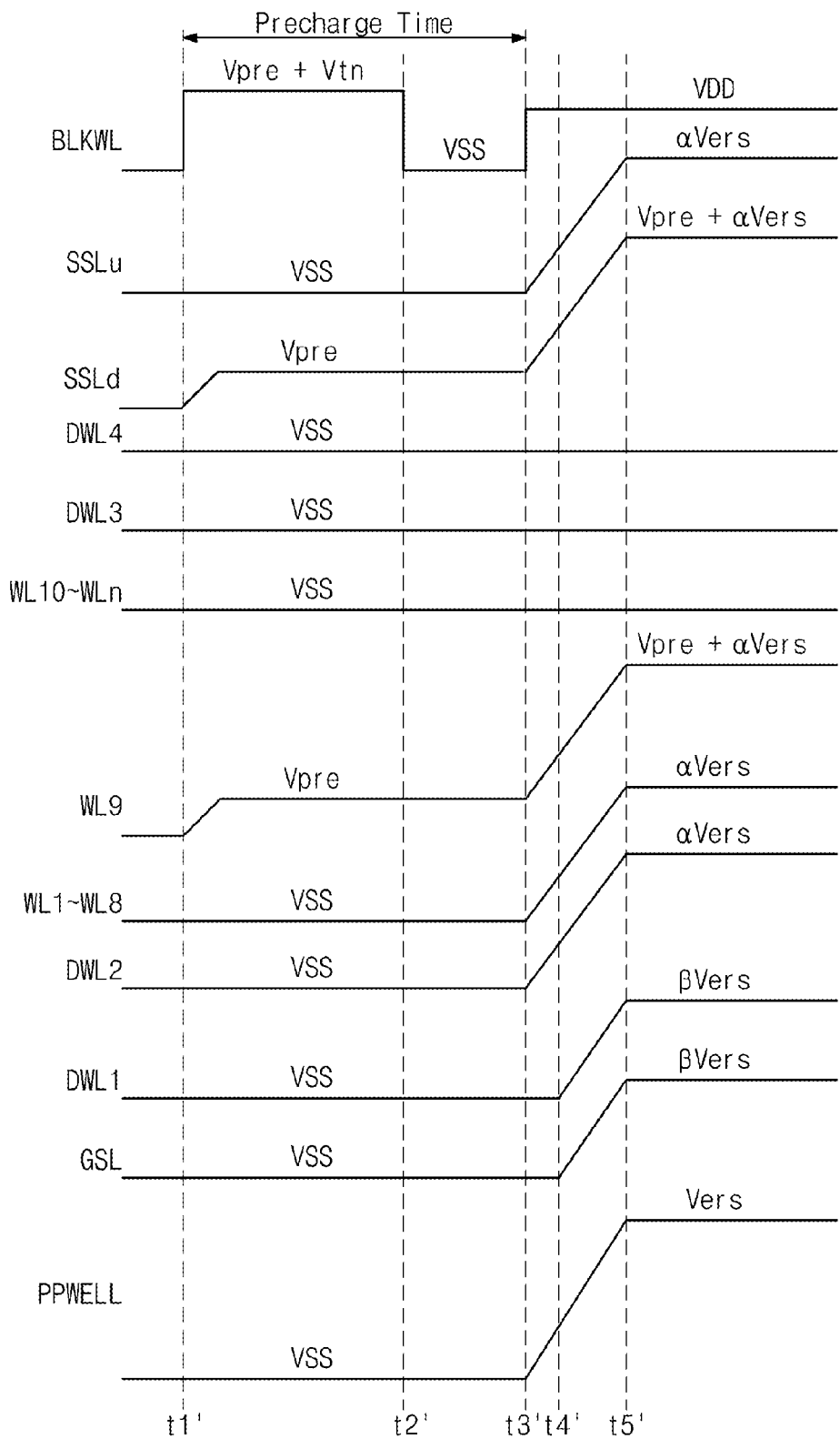
FIG. 16 is a timing diagram illustrating a voltage change of an erase method in accordance with example embodiments of inventive concepts.

FIG. 16 is a timing diagram illustrating a voltage change of an erase method in accordance with example embodiments of inventive concepts. Referring to FIGS. 12 through 16, the precharge voltage Vpre may be applied to the first string select line SSLd and the ninth word line WL9 during a first time (t1') through a third time (t3').

At the third time (t3'), the first string select line SSLd and the ninth word line WL9 are floated. The erase voltage Vers may be applied to the substrate PPWELL. As the erase voltage Vers is applied to the substrate PPWELL, voltages of the first string select line SSLd and the ninth word line WL9 increase. Voltages of the first through eighth word lines WL1~WL8 and the second dummy word line DWL2 also increase. At a fourth time (t4'), the first dummy word line DWL1 and the ground select line GSL are floated. As the erase voltage Vers is applied to the substrate PPWELL, voltages of the first dummy word line DWL1 and the ground select line GSL increase.

At a fifth time (t5'), a voltage of the ninth word line WL9 reaches the third floating voltage Vpre+αVers. Voltages of the first through eighth word lines WL1~WL8 and the second dummy word line DWL2 reach the first floating voltage αVers.

As the voltage of the ninth word line WL9 reaches the third floating voltage Vpre+αVers, the amount of holes being trapped in the charge storage layer 118 between memory cells connected to the ninth word line WL9 and memory cells connected to the tenth word line WL10 may be reduced. The amount of holes being trapped in the charge storage layer 118 between dummy memory cells connected to the fourth dummy word line DWL4 and the first string select transistor connected to the first string select line SSLd may be reduced.

Figure 17:
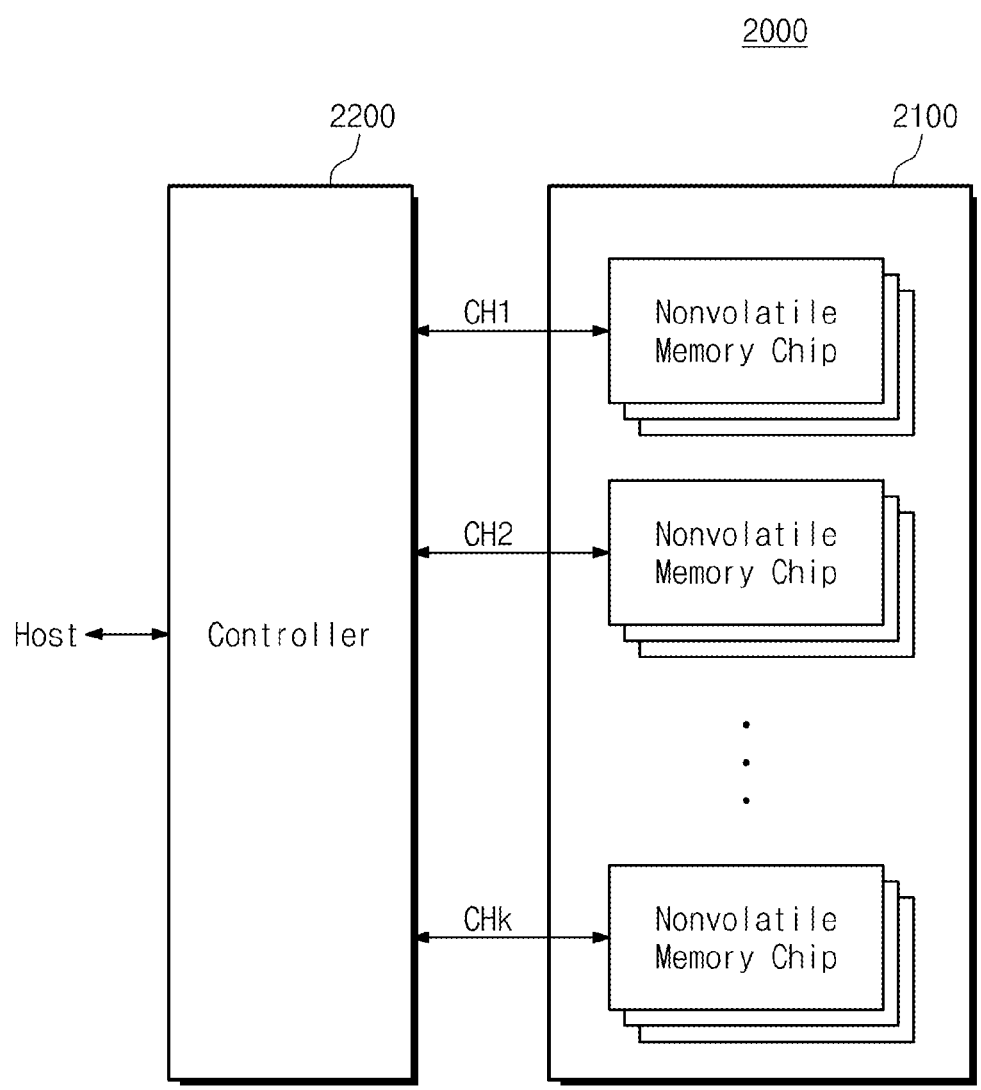
FIG. 17 is a block diagram illustrating a memory system in accordance with example embodiments of inventive concepts.

FIG. 17 is a block diagram illustrating a memory system in accordance with example embodiments of inventive concepts. Referring to FIG. 17, the memory system 2000 includes a nonvolatile memory device 2100 and a controller 2200. The nonvolatile memory device 2100 includes a plurality of nonvolatile memory chips. The nonvolatile memory chips are divided into a plurality of groups. Each group of the nonvolatile memory chips may be configured to communicate with the controller 2200 through one common channel. The nonvolatile memory chips communicate with the controller 2200 through first through kth channels CH1~CHk.

Each of the nonvolatile memory chips includes a plurality of cell strings CS11, CS12, CS21 and CS22 being provided on a substrate 111. Each of the cell strings CS11, CS12, CS21 and CS22 includes a plurality of cell transistors TS stacked in a direction perpendicular to the substrate 111. Each of nonvolatile memory chips may be configured to control string select lines SSL1 and SSL2 and a ground select line GSL in response to an erase voltage Vers being applied.

The controller 2200 may be connected to a host and the nonvolatile memory device 2100. In response to a request of the host, the controller 2200 may be configured to access the nonvolatile memory device 2100. For example, the controller 2200 may be configured to control read, write, erase and background operations of the nonvolatile memory device 2100. The controller 2200 may be configured to provide an interface between the nonvolatile memory device 2100 and the host. The controller 2200 may be configured to drive firmware for controlling the nonvolatile memory device 2100.

The controller 2200 may be configured to provide a control signal CTRL and an address ADDR to the nonvolatile memory device 2100. In response to the control signal CTRL and the address ADDR being provided from the controller 2200, the nonvolatile memory device 2100 may be configured to perform read, write and erase operations.

The controller 2200 and the nonvolatile memory device 2100 can be integrated in one semiconductor device to constitute a solid state drive (SSD). The solid state drive (SSD) includes a storage device configured to store data in a semiconductor memory. In the case that the memory system 2000 may be used as the SSD, an operation speed of the host connected to the memory system 2000 may be greatly improved.

In FIG. 17, a plurality of nonvolatile memory chips may be connected to one channel. However, the memory system 2000 may be modified so that one nonvolatile memory chip may be connected to one channel.

The nonvolatile memory device 2100 may include a constitution of precharging the string select line described through FIGS. 1 through 16.

Figure 18:
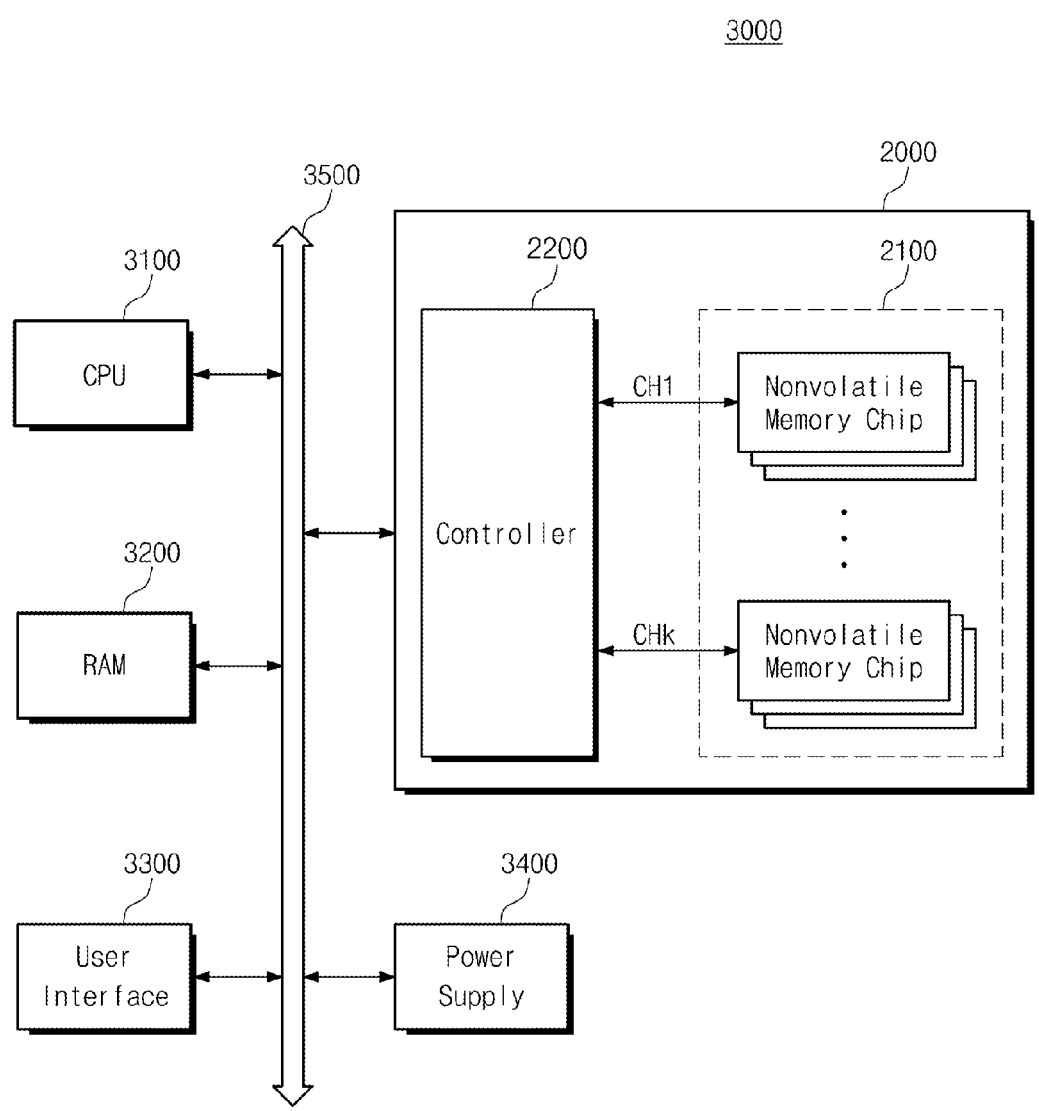
FIG. 18 is a block diagram illustrating a computing system including a memory system in accordance with example embodiments of inventive concepts.

FIG. 18 is a block diagram illustrating a computing system including a memory system in accordance with example embodiments of inventive concepts. Referring to FIG. 18, the computing system 3000 includes a central processing unit (CPU) 3100, a random access memory (RAM) 3200, a user interface 3300, a power supply 3400 and a memory system 2000.

The memory system 2000 may be electrically connected to the central processing unit (CPU) 3100, the random access memory (RAM) 3200, the user interface 3300 and the power supply 3400 through a system bus 3500. Data provided through the user interface 3300 or processed by the central processing unit 3100 may be stored in the memory system 2000.

In FIG. 18, the nonvolatile memory device 2100 may be connected to the system bus 3500 through the controller 2200. However, the nonvolatile memory device 2100 may be configured to be directly connected to the system bus 3500.

In FIG. 18, the memory system 2000 described with reference to FIG. 17 is provided. The computing system 3000 may be configured to include all the memory systems 1000 and 2000 described with reference to FIG. 17.

According to example embodiments of inventive concepts, a nonvolatile memory device, an erase method thereof and a memory system including the same that can reduce a threshold voltage reduction phenomenon of a string select transistor or a memory cell by reducing the amount of holes being trapped in a fringing field through a precharge operation of a string select line or a word line can be provided.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
a memory cell array including a plurality of cell strings on a substrate, each of the cell strings including a plurality of cell transistors stacked on top of each other in a direction perpendicular to the substrate;
an address decoder connected to the cell strings through a ground select line, word lines, dummy word lines and string select lines;
a read & write circuit connected to the cell strings through bit lines; and
a voltage generator,
the voltage generator being configured to apply a precharge voltage during a first time of an erase operation to a first string select line among the string select lines, the first string select line being adjacent to the word lines,
the voltage generator being configured to apply an erase voltage to the substrate and to apply voltages to the address decoder so that the first string select line is floated according to the erase voltage after applying the precharge voltage during the first time to the first string select line,
wherein the address decoder is configured to concurrently float the ground select line and a dummy word line adjacent to the ground select line among the dummy word lines between the ground select line and the word lines.

2. The nonvolatile memory device of claim 1, wherein the address decoder is configured to float the first string select line when the voltage generator applies the erase voltage to the substrate.

3. The nonvolatile memory device of claim 1, wherein the string select lines includes a second string select line above the first string select line, and
the address decoder is configured to float the second string select line when the first string select line is floated.

4. The nonvolatile memory device of claim 1, wherein the address decoder is configured to float the ground select line after a specific time from when the erase operation begins.

5. The nonvolatile memory device of claim 1, wherein some of the dummy word lines are between the first string select line and the word lines, and
the address decoder is configured to drive at least one of the dummy word lines between the first string select line and the word lines by using a word line erase voltage.

6. The nonvolatile memory device of claim 1, wherein the memory cell array comprises a plurality of sub blocks.

7. The nonvolatile memory device of claim 6, wherein
the address decoder is connected to the sub blocks through the word lines,
the address decoder is configured to apply a word line erase voltage to the word lines connected to a selected sub block among the plurality of sub blocks,
the address decoder is configured to apply a precharge voltage to a word line adjacent to the selected sub block and connected to an unselected sub block among the plurality of sub blocks during a time interval in the erase operation, and
the address decoder is configured to float all the word lines connected to the unselected sub block if the address decoder applies the erase voltage to the substrate.

8. The nonvolatile memory device of claim 7, wherein the selected sub block is between the unselected sub block and the first string select line.

9. A memory system comprising:
the nonvolatile memory device of claim 1; and
a controller configured to control the nonvolatile memory device.

10. A nonvolatile memory device comprising:
a plurality of cell strings on a substrate, each of the cell strings including a plurality of cell transistors stacked on top of each other between a ground select transistor and a string select transistor, each of the cell strings including at least one of,
a first dummy cell transistor between the string select transistor and the cell transistors, and
a second dummy cell transistor between the ground select transistor and the cell transistors; and
a control circuit connected to the substrate and connected to the plurality of cell strings through a plurality of bit lines, a ground select line, word lines, at least one dummy word line, and a string select line,
the control circuit during a first time interval of an erase operation being configured to apply a precharge voltage to at least one of the string select line and one of the word lines,
the control circuit, during the erase operation after the first time interval, being configured to apply an erase voltage to the substrate and float the string select line according to the erase voltage applied to the substrate.

11. A nonvolatile memory device comprising:
a plurality of cell strings on a substrate, each of the cell strings including a plurality of cell transistors stacked on top of each other between a ground select transistor and a string select transistor, each of the cell strings including at least one of,
a dummy cell transistor between the string select transistor and the cell transistors, and
a dummy cell transistor between the ground select transistor and the cell transistors; and
a control circuit connected to the substrate and connected to the plurality of cell strings through a plurality of bit lines, a ground select line, word lines, at least one dummy word line, and a string select line,
the control circuit during a first time interval of an erase operation being configured to apply a precharge voltage to at least one of the string select line and one of the word lines,
the control circuit, during the erase operation after the first time interval, being configured to apply an erase voltage to the substrate and float the string select line according to the erase voltage applied to the substrate, wherein the string select transistor in each of the cell strings is a first string select transistor, the cell strings each include a second string select transistor on the first string select transistor, the dummy cell transistor between the ground select transistor and the cell transistors is a first dummy cell transistor, the cell strings each include a second dummy cell transistor between the cell transistors and the first dummy cell transistor, the dummy cell transistor between the first string select transistor and the cell transistors is a third dummy cell transistor, and the cell strings each include a fourth dummy cell transistor between the first string select transistor and the third dummy cell transistor.

12. The nonvolatile memory device of claim 11, wherein the string select line is a first string select line that connects the control circuit to the first string select transistors of the cell strings in a same row of the cell strings, the second string select transistors in the same row of cell strings are connected to the control circuit through a second string select line, the control circuit during the first interval of the erase operation is configured to apply a ground voltage to the second string select line, the control circuit during the erase operation after the first time interval is configured to float the first string select line at a first voltage level and to float the second string select line at a second voltage level according to the erase voltage applied to the substrate, and the first voltage level is less than the second voltage level.

13. The nonvolatile memory device of claim 11, wherein the string select line is a first string select line that connects the control circuit to the first string select transistors of the cell strings in a same row of the cell strings, the second string select transistors in the same row of cell strings are connected to the control circuit through a second string select line, the control circuit during the first interval of the erase operation is configured to apply a ground voltage to the first string select line and the second string select line and to apply the precharge voltage to the one of the word lines, the control circuit during the erase operation after the first time interval is configured to float the one of the word lines at a first voltage level and to float the first and second string select lines at a second voltage level according to the erase voltage applied to the substrate, the first voltage level is less than the second voltage level, and the one of the word lines is a middle word line among the word lines connecting the control circuit to the cell strings.

14. The nonvolatile memory device of claim 11, the string select line is a first string select line that connects the control circuit to the first string select transistors of the cell strings in a same row of the cell strings, the second string select transistors in the same row of cell strings are connected to the control circuit through a second string select line, the control circuit during the first interval of the erase operation is configured to apply a ground voltage to the second string select line and to apply the precharge voltage to both the first string select line and the one of the word lines, the control circuit during the erase operation after the first time interval is configured to float both the one of the word lines and the first string select line at a first voltage level and to float the second string select line at a second voltage level according to the erase voltage applied to the substrate, the first voltage level is less than the second voltage level, and the one of the word lines is a middle word line among the word lines connecting the control circuit to the cell strings.

15. The nonvolatile memory device of claim 1, wherein the voltage generator is configured to apply a word line erase voltage to the ground select line when the precharge voltage is applied to the first string select line during the first time of the erase operation.

16. The nonvolatile memory device of claim 10, wherein the control circuit is configured to apply the ground voltage to the ground select line during the first time interval of the erase operation when the precharge voltage is applied to the at last one of the string select line and one of the word lines.

17. The nonvolatile memory device of claim 1, wherein the memory cell array is configured a three-dimensional memory array, and each of the memory cells includes a charge trap layer.

* * * * *